(12) United States Patent
Cho

(10) Patent No.: US 12,135,583 B2
(45) Date of Patent: *Nov. 5, 2024

(54) DISPLAY DEVICE

(71) Applicant: Samsung Display Co., LTD., Yongin-si (KR)

(72) Inventor: Eui Ri Cho, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/492,303

(22) Filed: Oct. 23, 2023

(65) Prior Publication Data

US 2024/0045468 A1 Feb. 8, 2024

Related U.S. Application Data

(63) Continuation of application No. 17/313,516, filed on May 6, 2021, now Pat. No. 11,797,048.

(30) Foreign Application Priority Data

May 8, 2020 (KR) .......................... 10-2020-0055385

(51) Int. Cl.
| | | |
|---|---|---|
| *G06F 1/16* | (2006.01) | |
| *H10K 59/121* | (2023.01) | |
| *H10K 59/128* | (2023.01) | |
| *H10K 59/65* | (2023.01) | |

(52) U.S. Cl.
CPC .......... *G06F 1/1624* (2013.01); *G06F 1/1656* (2013.01); *H10K 59/121* (2023.02); *H10K 59/128* (2023.02); *H10K 59/65* (2023.02)

(58) Field of Classification Search
CPC ............................. G06F 1/1624; G06F 1/1656
See application file for complete search history.

(56) References Cited

U.S. PATENT DOCUMENTS

| | | |
|---|---|---|
| 4,782,522 A | 11/1988 | Kramer et al. |
| 5,252,950 A | 10/1993 | Saunders et al. |
| 5,266,930 A | 11/1993 | Ichikawa et al. |
| 5,267,127 A | 11/1993 | Pollitt |
| 5,335,274 A | 8/1994 | Masuda et al. |
| 5,543,588 A | 8/1996 | Bisset et al. |
| 5,657,370 A | 8/1997 | Tsugane et al. |

(Continued)

FOREIGN PATENT DOCUMENTS

KR 10-1810050 12/2017

*Primary Examiner* — Adrian S Wilson
(74) *Attorney, Agent, or Firm* — KILE PARK REED & HOUTTEMAN PLLC

(57) ABSTRACT

A display device includes a display panel including a first display area having first pixels, and a second display area having second pixels. The display device includes a lower member below the display panel, a supporting member extended to the display panel, and a first slide module disposed between the lower member and the supporting member, the first slide module enabling the lower member and the supporting member to move relative to each other in a direction. The second display area protrudes beyond the lower member in the direction due to a movement by the first slide module. A number of first pixels per a unit area of the first display area is greater than a number of second pixels per the unit area of the second display area.

13 Claims, 23 Drawing Sheets

(56) References Cited

U.S. PATENT DOCUMENTS

| | | |
|---|---|---|
| 5,661,641 A | 8/1997 | Shindo |
| 5,729,219 A | 3/1998 | Armstrong et al. |
| 5,767,818 A * | 6/1998 | Nishida .................... G09G 3/24 345/55 |
| 5,808,711 A | 9/1998 | Suppelsa et al. |
| D406,837 S | 3/1999 | Forget |
| 5,896,575 A | 4/1999 | Higginbotham et al. |
| 6,040,945 A | 3/2000 | Karasawa |
| 6,481,851 B1 | 11/2002 | McNelley et al. |
| 6,483,445 B1 | 11/2002 | England |
| 6,597,347 B1 | 7/2003 | Yasutake |
| 7,016,182 B2 | 3/2006 | Brandenberg et al. |
| D575,259 S | 8/2008 | Kim et al. |
| 7,502,221 B2 | 3/2009 | Fuller et al. |
| 7,636,591 B2 | 12/2009 | Kim et al. |
| 7,970,444 B2 | 6/2011 | Thornton et al. |
| 8,150,482 B2 | 4/2012 | Matsuoka |
| 8,200,298 B2 | 6/2012 | Matsuoka |
| 8,233,948 B2 | 7/2012 | Francisco et al. |
| 9,164,581 B2 | 10/2015 | Robinson et al. |
| 10,192,358 B2 | 1/2019 | Robbins |
| 10,290,622 B2 * | 5/2019 | Li ........................... H01L 24/83 |
| 10,304,965 B2 * | 5/2019 | Wang .................... H01L 29/786 |
| 11,004,363 B2 * | 5/2021 | Wu ....................... G09G 3/2074 |
| 11,797,048 B2 * | 10/2023 | Cho ....................... G06F 1/1652 |
| 2002/0044152 A1 | 4/2002 | Abbott, III et al. |
| 2003/0169213 A1 | 9/2003 | Spero |
| 2003/0184528 A1 | 10/2003 | Kawasaki et al. |
| 2003/0221876 A1 | 12/2003 | Doczy et al. |
| 2004/0169624 A1 | 9/2004 | Yamazaki et al. |
| 2004/0263056 A1 | 12/2004 | Seo et al. |
| 2005/0041009 A1 | 2/2005 | Kuroda |
| 2005/0146600 A1 | 7/2005 | Chipchase et al. |
| 2005/0264984 A1 | 12/2005 | Lee |
| 2007/0164988 A1 | 7/2007 | Ryu et al. |
| 2009/0009628 A1 | 1/2009 | Janicek |
| 2009/0091513 A1 | 4/2009 | Kuhn |
| 2009/0298547 A1 | 12/2009 | Kim et al. |
| 2010/0053151 A1 | 3/2010 | Marti et al. |
| 2010/0073404 A1 | 3/2010 | Brown et al. |
| 2010/0253593 A1 | 10/2010 | Seder et al. |
| 2010/0277420 A1 | 11/2010 | Charlier et al. |
| 2010/0277421 A1 | 11/2010 | Charlier et al. |
| 2010/0277439 A1 * | 11/2010 | Charlier ................ G06F 1/1626 345/176 |
| 2012/0099250 A1 | 4/2012 | Robinson et al. |
| 2017/0069871 A1 * | 3/2017 | Yim ...................... H10K 50/844 |
| 2020/0286424 A1 * | 9/2020 | Thielemans ........... H01L 25/167 |

* cited by examiner

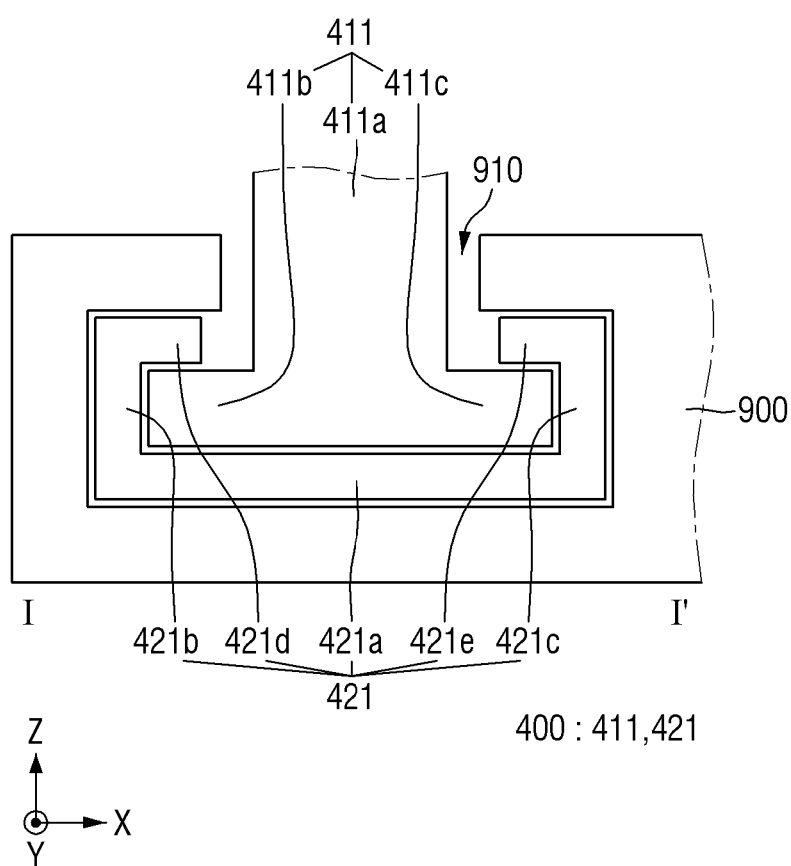

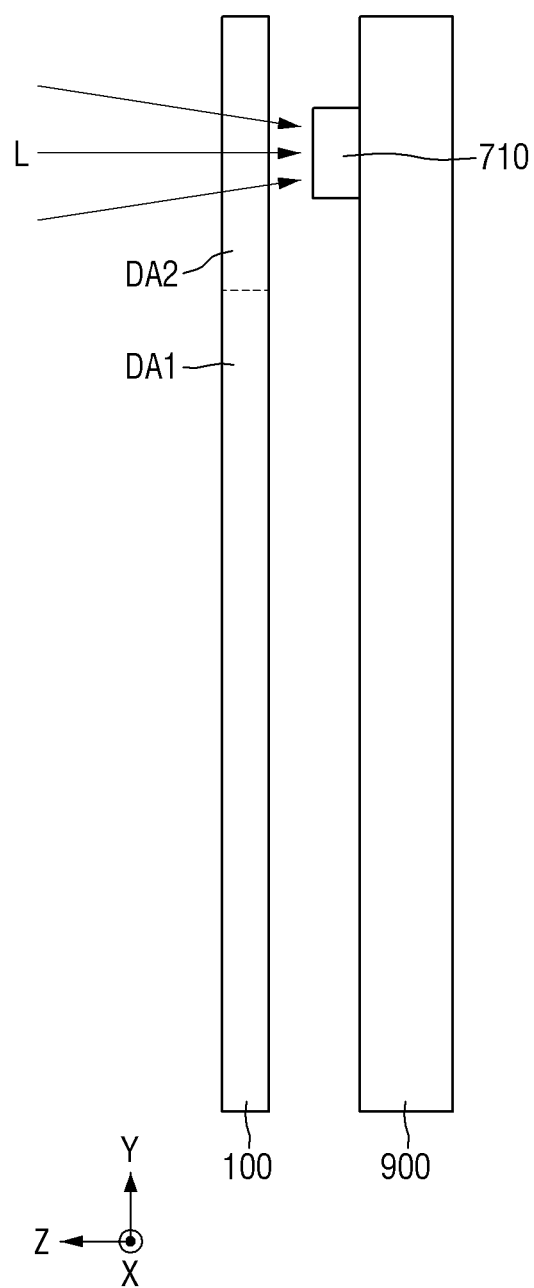

DISPLAY DEVICE

CROSS-REFERENCE TO RELATED APPLICATION(S)

This is a continuation application of U.S. patent application Ser. No. 17/313,516, filed May 6, 2021, now U.S. Pat. No. 11,797,048, the disclosure of which is incorporated herein by reference in its entirety. U.S. patent application Ser. No. 17/313,516 claims priority to and benefits of Korean Patent Application No. 10-2020-0055385 under 35 U.S.C. § 119, filed May 8, 2020, in the Korean Intellectual Property Office, the entire contents of which are incorporated herein by reference.

BACKGROUND

1. Technical Field

The disclosure relates to a display device.

2. Description of the Related Art

Augmented reality is a technology that may superimpose virtual images on a real-world image actually being viewed by a user so as to provide a single integral image. The virtual images may be text or graphics images, and the real-world image may be information of an object that can actually be observed within the range of view of an augmented reality providing device.

Augmented reality can be realized by an augmented reality providing device such as a head-mounted display (HMD) or a head-up display (HUD), which may be inconvenient to be carried around.

Augmented reality can also be realized by adding a virtual image to an image captured by the camera of a portable display device. However, captured images may not be considered augmented reality because they may not be actually real.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments may provide a display device which can realize augmented reality by superimposing a virtual image on a real image with a portable display device such as a smartphone.

Additional features of embodiments will be set forth in the description which follows, and in part may be apparent from the description, or may be learned by practice of an embodiment herein.

According to an embodiment, a display device may include a display panel including a first display area having first pixels, and a second display area having second pixels. The display device may include a lower member below the display panel, a supporting member extended to the display panel, and a first slide module disposed between the lower member and the supporting member, the first slide module enabling the lower member and the supporting member to move relative to each other in a direction. The second display area may protrude beyond the lower member in the direction due to a movement by the first slide module. A number of the first pixels per a unit area of the first display area may be greater than a number of the second pixels per the unit area of the second display area.

The second display area may further include transmissive areas disposed adjacent to the second pixels.

Each of the transmissive areas may surround M second pixels, where M may be a positive integer.

The display device may further include a camera sensor overlapping the second display area in a thickness direction of the display panel when the second display area is not to protrude beyond the lower member in the direction.

When the second display area protrudes beyond the lower member due to the movement by the first slide module, the second display area may not overlap the camera sensor in the thickness direction of the display panel.

The first slide module may include a first slide rail disposed in a slide groove of the lower member, and a first slide protrusion disposed on the supporting member and extended to the first slide rail.

The supporting member may include a first supporting member extended to the first display area of the display panel, and a second supporting member extended to the second display area of the display panel.

The display device may further include a second slide module disposed between the first supporting member and the second supporting member, the second slide module enabling the first supporting member and the second supporting member to move relative to each other.

The second slide module may include a second slide rail disposed in a slide groove of the first supporting member, and a second slide protrusion disposed on the second supporting member and extended to the second slide rail.

The second display area of the display panel may be stretched in the direction due to a movement by the second slide module.

The second display area of the display panel may have a first area when the second display area protrudes beyond the lower member in the direction due to the movement by the first slide module and may be stretched in the direction due to the movement by the second slide module. The second display area of the display panel may have a second area when the second display area protrudes beyond the lower member in the direction due to the movement by the first slide module and is not stretched in the direction. The first area may be greater than the second area.

According to an embodiment, a display device may include a display panel including a first display area having first pixels, and a second display area having second pixels. The display device may include a lower member below the display panel, a first supporting member extended to the first display area of the display panel, a second supporting member extended to the second display area of the display panel, and a slide module disposed between the first supporting member and the second supporting member, the slide module enabling the first supporting member and the second supporting member to move relative to each other in a direction. The second display area of the display panel may be stretched in the direction due to a movement by the slide module.

A number of first pixels per a unit area of the first display area may be greater than a number of second pixels per the unit area of the second display area.

The second display area may further include transmissive areas disposed adjacent to the second pixels.

Each of the transmissive areas may surround M second pixels (where M may be a positive integer).

When the second display area of the display panel is stretched in the direction due to the movement by the slide module, a portion of the second display area may protrude beyond the lower member in the direction.

The display device may further include a camera sensor overlapping the second display area in a thickness direction of the display panel.

The portion of the second display area may not overlap the camera sensor in the thickness direction of the display panel.

The second display area may have a first area when the second display area is stretched in the direction due to the movement by the slide module, the second display area may have a second area when the second display area is not stretched in the direction, and the first area may be greater than the second area.

The slide module may include a slide rail disposed in a slide groove of the first supporting member, and a slide protrusion disposed on the second supporting member and extended to the slide rail.

According to an embodiment, a second display area of a display panel may include transmissive areas, which may transmit light therethrough. Thus, when the second display area of the display panel protrudes beyond a lower member in one direction due to a slidable movement, light incident from the rear of a display device can be incident upon the eye of a user at the front of the display device, through the transmissive areas. Accordingly, the user can see not only the background at the rear of the display device through the transmissive areas of the second display area, but also a virtual image displayed in the second display area, at the same time. Since a real image and a virtual image can be superimposed on each other in the second display area, the display device can provide the user with augmented reality.

According to an embodiment, since the second display area of the display panel may include cutout patterns, the second display area can be stretched in one direction to protrude beyond the lower member. Thus, light incident from the rear of the display device can be incident upon the eye of the user at the front of the display device, through the transmissive areas. Accordingly, the user can see not only the background at the rear of the display device through the transmissive areas of the second display area, but also a virtual image displayed in the second display area, at the same time. Since a real image and a virtual image can be superimposed on each other in the second display area, the display device can provide the user with augmented reality.

According to an embodiment, the second display area of the display panel may protrude beyond the lower member in one direction due to a slidable movement and may be stretched in one direction. The amount by which the second display area protrudes beyond the lower member can be further increased.

Other features and embodiments may be apparent from the following detailed description, the drawings, and the claims.

It is to be understood that both the foregoing description and the following detailed description are not to be construed as limiting of an embodiment as described or claimed herein.

BRIEF DESCRIPTION OF THE DRAWINGS

The accompanying drawings, which are included to provide a further understanding of the disclosure, illustrate embodiments:

FIG. 4B is a schematic cross-sectional view taken along line I-I' of FIG. 4A;

FIGS. 5 and 6 are schematic side views illustrating a display panel, a camera sensor, and the lower member of FIG. 3;

DETAILED DESCRIPTION OF THE EMBODIMENTS

Figure 1:
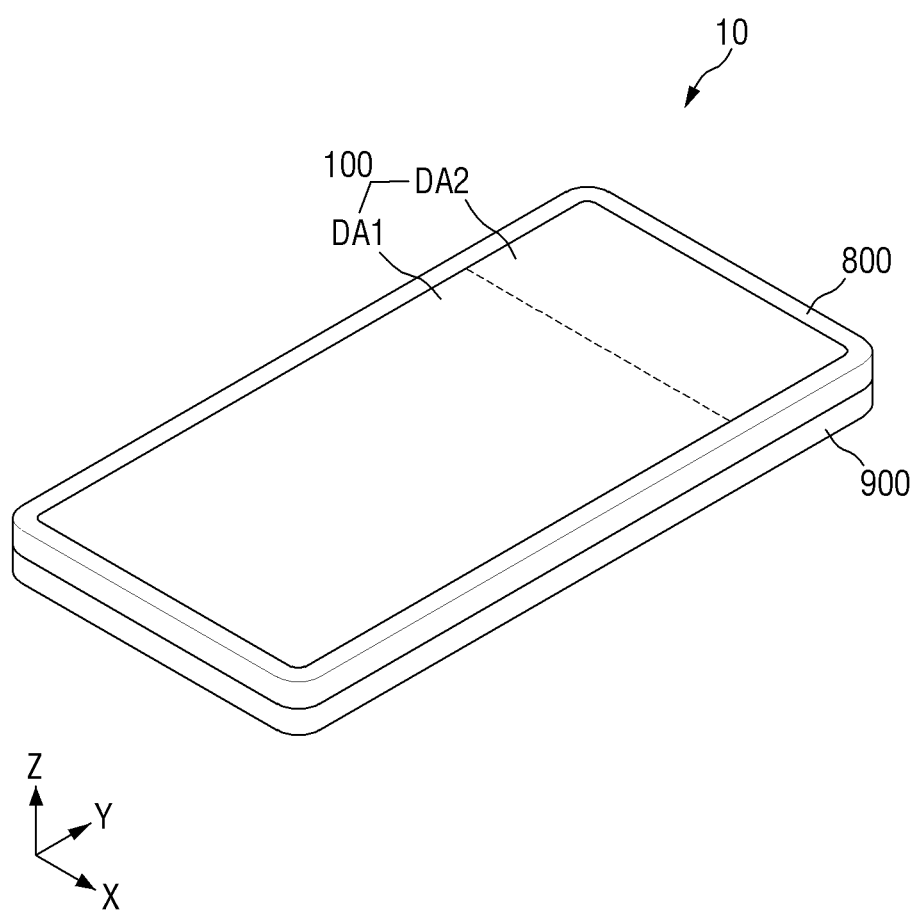
FIGS. 1 and 2 are schematic perspective views of a display device according to an embodiment of the disclosure.

The embodiments will now be described more fully hereinafter with reference to the accompanying drawings. The embodiments may, however, be provided in different forms and should not be construed as limiting. The same reference numbers indicate the same components throughout the disclosure. In the accompanying figures, the thickness of layers and regions may be exaggerated for clarity.

Some of the parts which are not associated with the description may not be provided in order to describe embodiments of the disclosure.

It will also be understood that when a layer is referred to as being "on" another layer or substrate, it can be directly on the other layer or substrate, or intervening layers may also be present. In contrast, when an element is referred to as being "directly on" another element, there may be no intervening elements present.

Further, the phrase "in a plan view" means when an object portion is viewed from above, and the phrase "in a schematic cross-sectional view" means when a schematic cross-section taken by vertically cutting an object portion is viewed from the side. The terms "overlap" or "overlapped" mean that a first object may be above or below a second object, and vice versa. The expression "not overlap" may include "apart from" or "set aside from" or "offset from" and any other suitable equivalents as would be appreciated and understood by those of ordinary skill in the art. The terms "face" and "facing" mean that a first object may directly or indirectly oppose a second object. In a case in which a third object intervenes between a first and second object, the first and second objects may be understood as being indirectly opposed to one another, although still facing each other.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

When an element is referred to as being "connected" to another element, the element may be "directly connected" to another element, or "electrically connected" to another element with one or more intervening elements interposed therebetween. It will be further understood that when the terms "comprises," "comprising," "has", "have", "having", "includes" and/or "including" are used, they may specify the presence of stated features, integers, steps, operations, elements and/or components, but do not preclude the presence or addition of other features, integers, steps, operations, elements, components, and/or any combination thereof.

It will be understood that, although the terms "first," "second," "third," or the like may be used herein to describe various elements, these elements should not be limited by these terms. These terms are used to distinguish one element from another element or for the convenience of description and explanation thereof. For example, when "a first element" is discussed in the description, it may be termed "a second element" or "a third element," and "a second element" and "a third element" may be termed in a similar manner without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B."

Unless otherwise defined or implied, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

Figure 2:
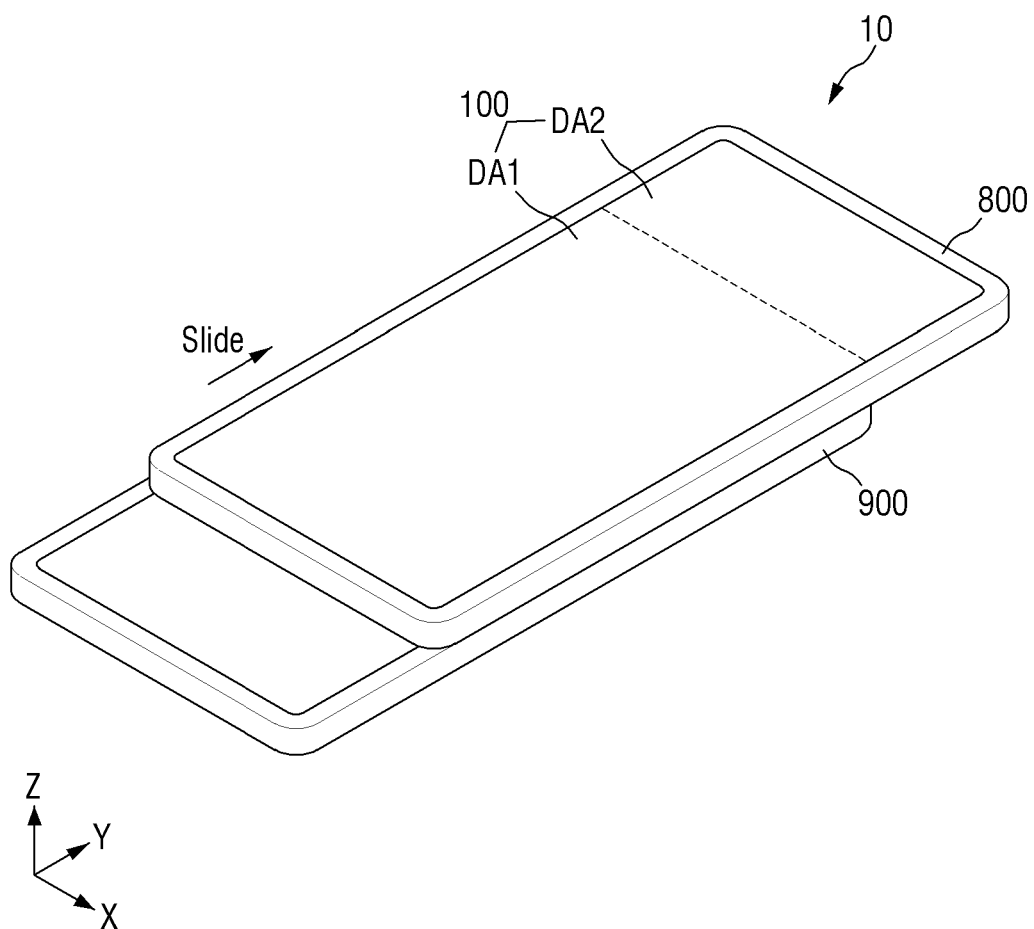

FIGS. 1 and 2 are schematic perspective views of a display device according to an embodiment of the disclosure.

Referring to FIGS. 1 and 2, a display device 10, which may be a device displaying a moving or still image, may be used or embodied as not only in a portable electronic device such as a mobile phone, a smartphone, a tablet personal computer (PC), a smartwatch, a watchphone, a mobile communication terminal, an electronic notepad, an electronic book, a portable multimedia player (PMP), a navigation device, or an ultramobile PC (UMPC), but also in or as various other products such as a television (TV), a notebook computer, a monitor, a billboard, or an Internet-of-Things (IoT) device.

The display device 10 may be a light-emitting display device such as an organic light-emitting diode (OLED) display device using OLEDs, a quantum-dot light-emitting diode (QLED) display device including a quantum-dot light-emitting layer, an inorganic light-emitting element (ILED) display device including an inorganic semiconductor, or a micro-light-emitting diode (micro-LED) display device using micro-LEDs. The display device 10 will hereinafter be described as being an OLED display device, but the disclosure is not limited thereto.

The display device 10 may be formed in a rectangular shape having short sides in a first direction (or an X-axis direction) and long sides in a second direction (or a Y-axis direction), in a plan view. The corners where the short sides and the long sides meet may be rounded to have a curvature or may be right-angled. The planar shape of the display device 10 is not particularly limited, and the display device 10 may also be formed in various other shapes such as a non-tetragonal polygonal shape, a circular shape, or an elliptical shape in a plan view. The display device 10 may be formed to be flat, but the disclosure is not limited thereto. In other embodiments, the display device 10 may include curved parts, which may be formed at both ends of the display device 10 and have a uniform or varying curvature. In yet other embodiments, the display device 10 may be formed to be flexible such as bendable, foldable, or rollable.

The display device 10 may include a display panel 100, a supporting member 800, and a lower member 900.

The display panel 100 may include first and second display areas DA1 and DA2. The first display area DA1 may include first pixels for displaying an image. The second display area DA2 may include second pixels for displaying an image and transmissive areas that may transmit light therethrough.

The first display area DA1 may be larger than the second display area DA2. The second display area DA2 may be disposed on a side of an edge of the display panel 100. FIG. 2 illustrates that the second display area DA2 may be disposed on the side of the upper edge of the display panel 100, but the disclosure is not limited thereto. In other embodiments, the second display area DA2 may be disposed on the side of the lower, left, or right edge of the display panel 100.

The number of second pixels per unit area (or pixels per inch (PPI)) of the second display area DA2 may be smaller than the number of first pixels per unit area of the first display area DA1. Here, the term "unit area" refers to an area for calculating the pixel density, for example, a rectangular area having a size of 1 inch in the first direction (or the X-axis direction) and 1 inch in the second direction (or the Y-axis direction), in a plan view.

The supporting member 800 may be extended to, and support, the display panel 100. The supporting member 800 may surround four side surfaces of the display panel 100. The supporting member 800 may be formed as a rectangular frame, but the disclosure is not limited thereto. The supporting member 800 may be attached to the side surfaces of the display panel 100 via an adhesive member such as a pressure sensitive adhesive.

The lower member 900 may be disposed below the display panel 100. The lower member 900 may be a lower cover or a lower case that forms the rear exterior of the display device 10. The lower member 900 may include plastic, a metal, or both.

Figure 3:
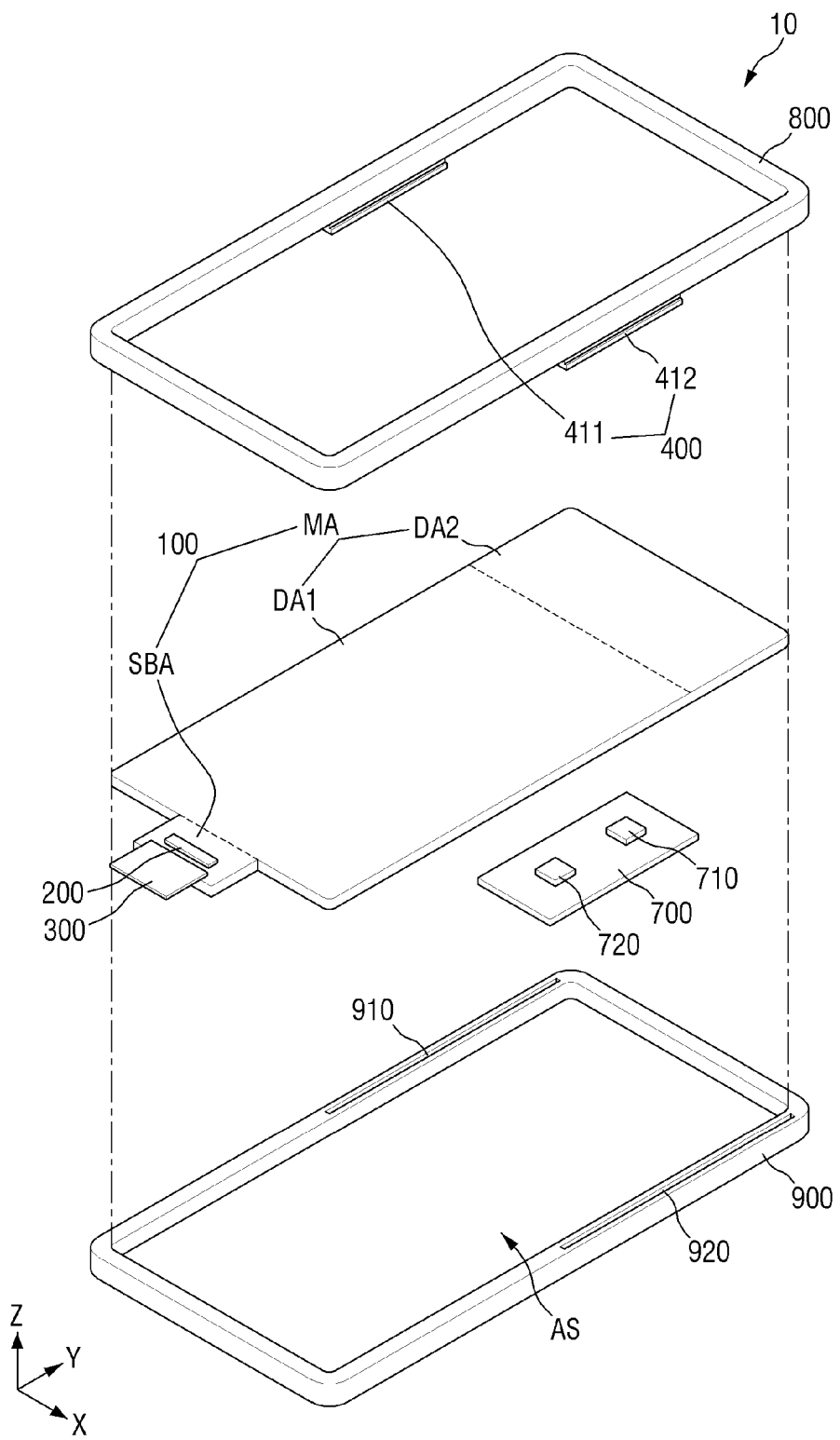
FIG. 3 is an exploded schematic perspective view of the display device of FIGS. 1 and 2.

The lower member 900 may be extended to the supporting member 800 via a first slide module (400 of FIG. 3). As a result, as illustrated in FIG. 2, the supporting member 800 and the lower member 900 can slidably move relative to each other in the second direction (or the Y-axis direction) due to the first slide module (400 of FIG. 3). The supporting member 800 can move, and thereby protrude beyond, the lower member 900 in the second direction (or the Y-axis direction) due to the first slide module (400 of FIG. 3).

In other embodiments, the supporting member 800 and the lower member 900 can slidably move relative to each other in the first direction (or the X-axis direction) due to the first slide module (400 of FIG. 3). The supporting member 800 can move, and thereby protrude beyond, the lower member 900 in the first direction (or the X-axis direction) due to the first slide module (400 of FIG. 3).

In a case where the supporting member 800 and the lower member 900 slidably move relative to each other in the second direction (or the Y-axis direction) due to the first slide module (400 of FIG. 3), one side of the supporting member 800 may protrude beyond one side of the lower member 900 due to the first slide module (400 of FIG. 3). For example, as illustrated in FIG. 2, the upper side of the supporting member 800 may protrude beyond the upper side of the lower member 900 due to the first slide module (400 of FIG. 3), but the disclosure is not limited thereto. In another example, the lower side of the supporting member 800 may protrude beyond the lower side of the lower member 900 due to the first slide module (400 of FIG. 3). In other embodiments, the supporting member 800 and the lower member 900 may slidably move relative to each other in the first direction (or the X-axis direction) due to the first slide module (400 of FIG. 3), and as a result, the left or right side of the supporting member 800 may protrude beyond the left or right side of the lower member 900 due to the first slide module (400 of FIG. 3).

The first slide module (400 of FIG. 3) may be disposed to be hidden from view from the outside, as illustrated in FIGS. 1 and 2. The first slide module (400 of FIG. 3) will be described later in detail with reference to FIGS. 3, 4A, and 4B.

As illustrated in FIGS. 1 and 2, in case that the supporting member 800 and the lower member 900 slidably move relative to each other in one direction due to the first slide module (400 of FIG. 3), the supporting member 800 may protrude beyond the lower member 900 in one direction due to the first slide module (400 of FIG. 3). As a result, the second display area DA2, which may be disposed on the side of one edge of the display panel 100, may protrude beyond the lower member 900 in the direction where the supporting member 800 and the lower member 900 slidably move relative to each other. Thus, a user can see not only the background at the rear of the display device 10 through the transmissive areas of the second display area DA2, but also a virtual image displayed in the second display area DA2, at the same time. Since a real image and a virtual image can be superimposed on each other in the second display area DA2, the display device 10 can provide the user with augmented reality.

FIG. 3 is an exploded schematic perspective view of the display device of FIGS. 1 and 2.

Referring to FIG. 3, the display device 10 may include the display panel 100, the supporting member 800, and the lower member 900 and may further include a display driving circuit 200, a display circuit board 300, the first slide module 400, a main circuit board 700, a camera sensor 710, and a main processor 720.

The display panel 100 may include a main area MA and a subarea SBA. The main area MA refers to an area in which subpixels may be formed to display an image, and the subarea SBA refers to an area in which the display driving circuit 200 and the display circuit board 300 may be disposed. The main area MA may include the first and second display areas DA1 and DA2.

FIG. 3 illustrates that the subarea SBA may be unfolded, but the subarea SBA may be bent to be placed on the rear surface of the display panel 100. The subarea SBA may overlap the main area MA in the thickness direction of the display panel 100, i.e., in a Z-axis direction.

The display driving circuit 200 may be disposed in the subarea SBA of the display panel 100. The display driving circuit 200 may be formed as an integrated circuit (IC) and may be attached to the subarea SBA of the display panel 100 in a chip-on-glass (COG) or chip-on-plastic (COP) manner or via ultrasonic bonding. As a result, the display driving circuit 200 can be electrically connected to the display panel 100. In other embodiments, the display driving circuit 200 may be attached on the display circuit board 300.

The display circuit board 300 may be disposed in the subarea SBA of the display panel 100. The display circuit board 300 may be attached to pads in the subarea SBA of the display panel 100 via a conductive adhesive member such as an anisotropic conductive film. As a result, the display circuit board 300 can be electrically connected to the display panel 100. The display circuit board 300 may be a flexible printed circuit board, a printed circuit board, or a flexible film such as a chip-on-film.

The first slide module 400 may include a first slide protrusion 411, a second slide protrusion 412, a first slide rail (421 of FIG. 4B), and a second slide rail.

The first slide protrusion 411 may be disposed on the left side of the rear surface of the supporting member 800. The first slide protrusion 411 may extend in the second direction (or the Y-axis direction). The first slide protrusion 411 may be formed as a separate element from the supporting member 800, in which case, the first slide protrusion 411 may be attached or fixed to the left side of the rear surface of the supporting member 800. In other embodiments, the first slide protrusion 411 and the supporting member 800 may be integral with each other, in which case, the first slide protrusion 411 may protrude from the left side of the rear surface of the supporting member 800.

The second slide protrusion 412 may be disposed on the right side of the rear surface of the supporting member 800. The second slide protrusion 412 may extend in the second direction (or the Y-axis direction). The second slide protrusion 412 may be formed as a separate element from the supporting member 800, in which case, the second slide protrusion 412 may be attached or fixed to the right side of the rear surface of the supporting member 800. In other embodiments, the second slide protrusion 412 and the supporting member 800 may be integral with each other, in which case, the second slide protrusion 412 may protrude from the right side of the rear surface of the supporting member 800.

The first slide protrusion 411 may be extended to the first slide rail (421 of FIG. 4B), which may be disposed in a first slide groove 910 of the lower member 900. The first slide groove 910 of the lower member 900 may extend in the second direction (or the Y-axis direction).

The second slide protrusion 412 may be extended to the second slide rail, which may be disposed in a second slide groove 920 of the lower member 900. The second slide groove 920 of the lower member 900 may extend in the second direction (or the Y-axis direction).

The first slide module 400 will be described later in further detail with reference to FIGS. 4A and 4B.

The main circuit board 700 may be disposed on the rear surface of the display panel 100. The main circuit board 700 may be connected to the display circuit board 300 via a flexible cable or a flexible printed circuit board. As a result, the main circuit board 700 and the display circuit board 300 can be electrically connected. The main circuit board 700 may be a printed circuit board or a flexible printed circuit board. The lower member 900 may be formed as a storage container having a storage space AS, and the main circuit board 700 may be disposed in the storage space AS of the lower member 900.

The camera sensor 710 may be disposed on the main circuit board 700. The camera sensor 710 may output image data such as a still or moving image obtained by an image sensor to the main processor 720. The camera sensor 710 may be a complementary metal-oxide semiconductor (CMOS) image sensor or a charge-coupled device (CCD) sensor.

The camera sensor 710 may overlap the second display area DA2 of the display panel 100 in a third direction (or the Z-axis direction), which may be the thickness direction of the display panel 100. The camera sensor 710 may detect light incident from the front of the display device 10 through the transmissive areas of the second display area DA2. Even though the camera sensor 710 may overlap the display panel 100 in the third direction (or the Z-axis direction), the camera sensor 710 can capture an image of the front of the display device 10 through the transmissive areas of the second display area DA2.

The main processor 720 may be disposed on the main circuit board 700. The main processor 720 may control all functions of the display device 10. For example, the main processor 720 may transmit digital video data to the display driving circuit 200 via the display circuit board 300 so that the display panel 100 can display an image. Also, the main processor 720 may store image data received from the camera sensor 710.

Figure 4A:
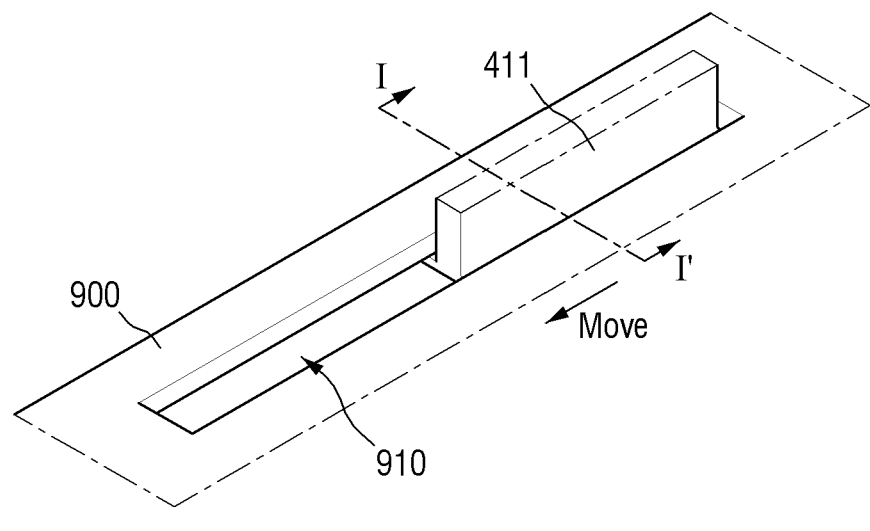
FIG. 4A is a schematic perspective view illustrating a first slide module and a lower member of FIG. 3.

FIG. 4A is a schematic perspective view illustrating the first slide module and the lower member of FIG. 3. FIG. 4B is a schematic cross-sectional view taken along line I-I' of FIG. 4A.

For convenience, FIGS. 4A and 4B illustrate only the first slide protrusion 411 and the first slide rail 421 of the first slide module 400 and the first slide groove 910 of the lower member 900.

Referring to FIGS. 4A and 4B, the first slide protrusion 411 may include a first extended portion 411a, a first protrusion inserting portion 411b, and a second protrusion inserting portion 411c. The first slide rail 421 may include a first bottom portion 421a, a first sidewall portion 421b, a second sidewall portion 421c, a first protruding portion 421d, and a second protruding portion 421e.

The first extended portion 411a may extend in the second direction (or the Y-axis direction). The lower end of the first extended portion 411a may be adjacent to the first bottom portion 421a of the first slide rail 421. The upper end of the first extended portion 411a may be extended to the supporting member 800.

The first protrusion inserting portion 411b may protrude from a side of the lower end of the first extended portion 411a in the first direction (or the X-axis direction). The first protrusion inserting portion 411b may protrude from the lower end of the first extended portion 411a in a leftward direction.

The second protrusion inserting portion 411c may protrude from another side of the lower end of the first extended portion 411a in the first direction (or the X-axis direction). The second protrusion inserting portion 411c may protrude from the lower end of the first extended portion 411a in a rightward direction.

The first sidewall portion 421b may protrude from the left side of the first bottom portion 421a in the third direction (or the Z-axis direction). The first sidewall portion 421b may protrude from the left side of the first bottom portion 421a in an upward direction. The first protruding portion 421d may protrude from the upper end of the first sidewall portion 421b in the first direction (or the X-axis direction). The first protruding portion 421d may protrude from the upper end of the first sidewall portion 421b in the rightward direction. Accordingly, the first bottom portion 421a, the first sidewall portion 421b, and the first protruding portion 421d of the first slide rail 421 may form a "C"- or bracket "C"-shaped space. Thus, the first protrusion inserting portion 411b may be inserted in the "C"- or bracket "C"-shaped space formed by the first bottom portion 421a, the first sidewall portion 421b, and the first protruding portion 421d of the first slide rail 421.

The second sidewall portion 421c may protrude from the right side of the first bottom portion 421a in the third direction (or the Z-axis direction). The second sidewall portion 421c may protrude from the right side of the first bottom portion 421a in the upward direction. The second protruding portion 421e may protrude from the upper end of the second sidewall portion 421c in the first direction (or the X-axis direction). The second protruding portion 421e may protrude from the upper end of the second sidewall portion 421c in the leftward direction. Accordingly, the first bottom portion 421a, the second sidewall portion 421c, and the second protruding portion 421e of the first slide rail 421 may form a "C"- or bracket "C"-shaped space. Thus, the second protrusion inserting portion 411c may be inserted in the "C"- or bracket "C"-shaped space formed by the first bottom portion 421a, the second sidewall portion 421c, and the second protruding portion 421e of the first slide rail 421.

The first slide groove 910 may be formed in part of the top surface of the lower member 900. The length, in the first direction (or the X-axis direction), of the first slide rail 421, which may be disposed on the bottom surface of the first slide groove 910, may be greater than the length, in the first direction (or the X-axis direction), of the first slide protrusion 411, which may be disposed at the entrance of the first slide groove 910. As a result, the first slide groove 910 may have a larger bottom surface than the entrance thereof. The length, in the first direction (or the X-axis direction), of the entrance of the first slide groove 910 may be smaller than the length, in the first direction (or the X-axis direction), of the bottom of the first slide groove 910.

As illustrated in FIGS. 4A and 4B, the first protrusion inserting portion 411b of the first slide protrusion 411 may be inserted in the "C"- or bracket "C"-shaped space formed by the first bottom portion 421a, the first sidewall portion 421b, and the first protruding portion 421d of the first slide rail 421, and the second protrusion inserting portion 411c of the first slide protrusion 411 may be inserted in the "C"- or bracket "C"-shaped space formed by the first bottom portion 421a, the second sidewall portion 421c, and the second protruding portion 421e of the first slide rail 421. As a result, the first slide protrusion 411 can slidably move in the second direction (or the Y-axis direction) due to the first slide rail 421.

The second slide protrusion 412 and the second slide rail of the first slide module 400 and the second slide groove 920 of the lower member 900 may be substantially the same as their respective counterparts described above with reference to FIGS. 4A and 4B. Thus, detailed descriptions of the second slide protrusion 412 and the second slide rail of the first slide module 400 and the second slide groove 920 of the lower member 900 will be omitted.

Figure 6:
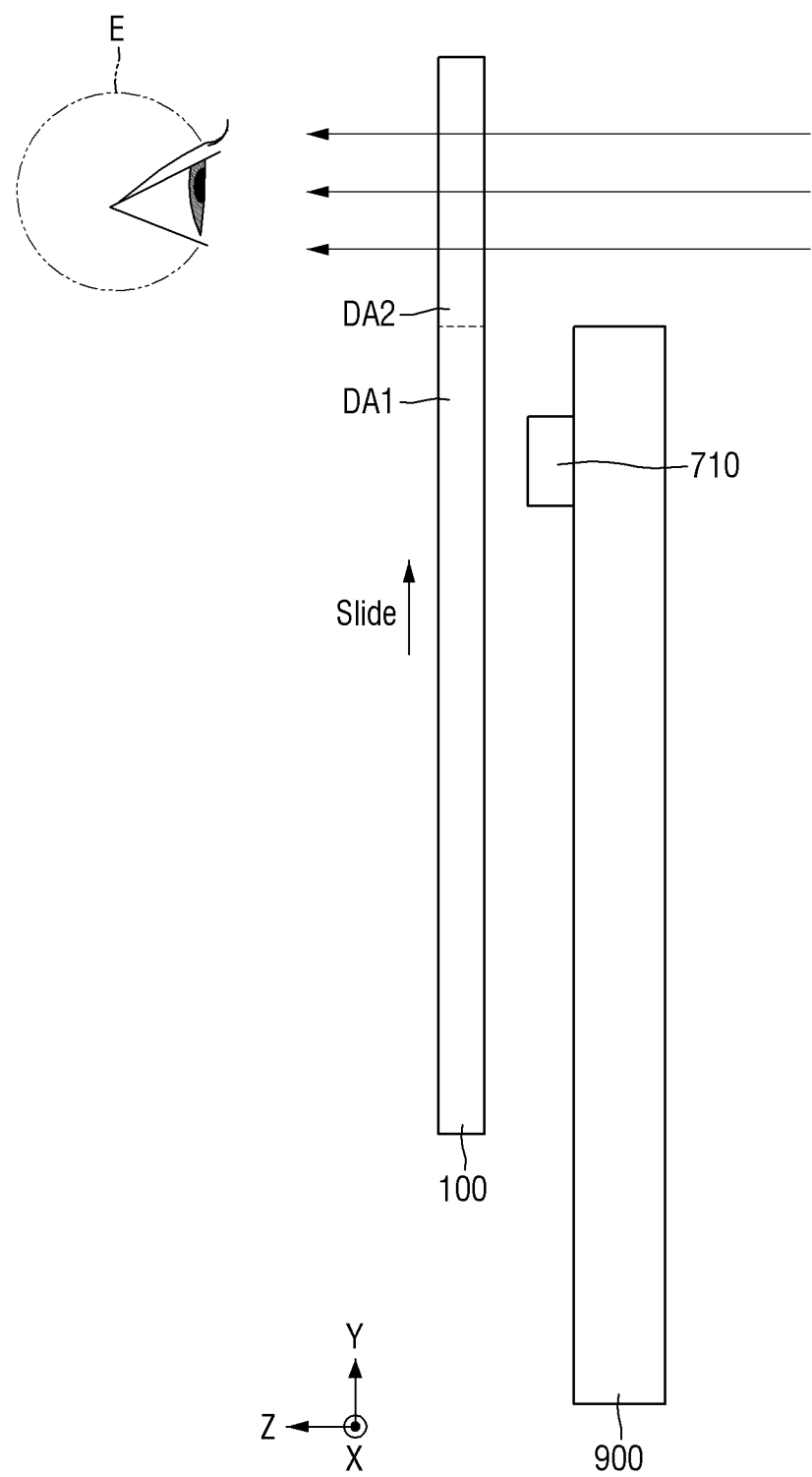

FIGS. 5 and 6 are schematic side views illustrating the display panel, the camera sensor, and the lower member of FIG. 3.

FIG. 5 illustrates a case where the second display area DA2 of the display panel 100 overlaps the lower member 900 in the third direction (or the Z-axis direction) due to the slidable movement by the first slide module 400, and FIG. 6 illustrates a case where the second display area DA2 of the display panel 100 protrudes beyond the lower member 900 in the second direction (or the Y-axis direction) due to the slidable movement by the first slide module 400. Referring to FIGS. 5 and 6, the main circuit board 700 may be disposed in the storage space AS of the lower member 900, as illustrated in FIG. 3, and the camera sensor 710 may be disposed to protrude beyond the lower member 900 in the third direction (or the Z-axis direction). However, the disclosure is not limited to this example.

Referring to FIG. 5, in case that the second display area DA2 of the display panel 100 does not protrude beyond the lower member 900 in the second direction (or the Y-axis direction), the second display area DA2 may overlap the camera sensor 710 in the third direction (or the Z-axis direction). Thus, the camera sensor 710 may detect light L incident from the front of the display device 10 through the transmissive areas of the second display area DA2. Even though the camera sensor 710 may overlap the display panel 100 in the third direction (or the Z-axis direction), the camera sensor 710 can capture an image of the front of the display device 10 through the transmissive areas of the second display area DA2.

Referring to FIG. 6, in case that the second display area DA2 of the display panel 100 protrudes beyond the lower member 900 in the second direction (or the Y-axis direction), the second display area DA2 may not overlap the lower member 900 in the third direction (or the Z-axis direction). Thus, light incident from the rear of the display device 10 can be incident upon an eye E of the user at the front of the display device 10 through the transmissive areas in the second display area DA2. Even though the eye E of the user may overlap the display panel 100 in the third direction (or the Z-axis direction), the eye E of the user can see the background at the rear of the display device 10 through the transmissive areas of the second display area DA2. Therefore, the user can see not only the background at the rear of the display device 10 through the transmissive areas of the second display area DA2, but also a virtual image displayed in the second display area DA2. In other words, since a real image and a virtual image can be superimposed on each other in the second display area DA2, the display device 10 can provide the user with augmented reality.

Figure 7:
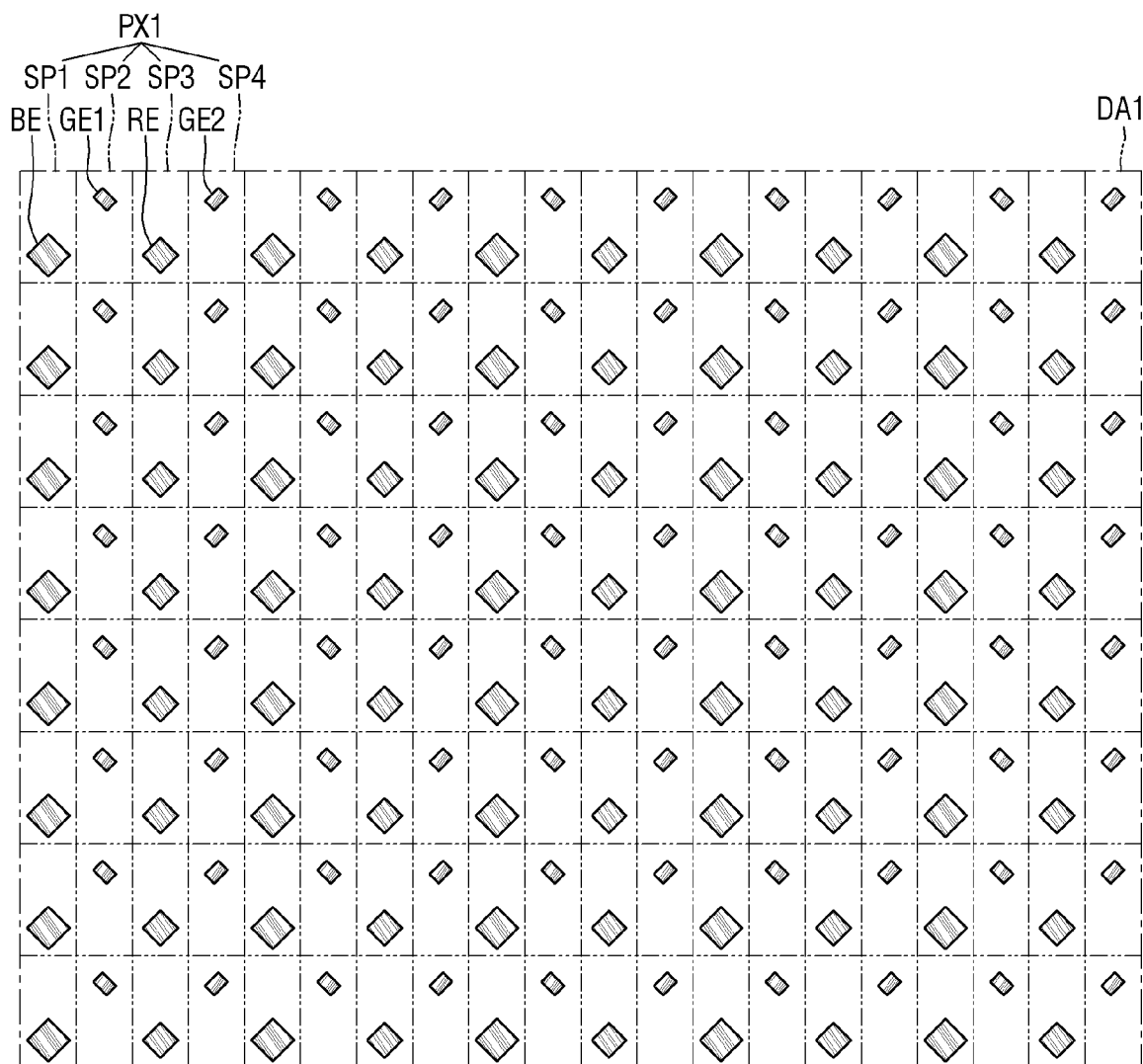
FIG. 7 is a schematic plan view illustrating pixels in a first display area of the display panel of FIG. 3.

FIG. 7 is a schematic plan view illustrating pixels in the first display area of the display panel of FIG. 3.

Referring to FIG. 7, the first display area DA1 of the display panel 100 may include first pixels PX1, which may be for displaying an image. Each of the first pixels PX1 may include first, second, third, and fourth subpixels SP1, SP2, SP3, and SP4. The first, second, third, and fourth subpixels SP1, SP2, SP3, and SP4 may be arranged in the first direction (or the X-axis direction).

The first subpixel SP1 may include a first emission area BE that emits light of a first color. The second subpixel SP2 may include a second emission area GE1 that emits light of a second color. The third subpixel SP3 may include a third emission area RE that emits light of a third color. The fourth subpixel SP4 may include a fourth emission area GE2 that emits light of a fourth color.

The first, second, third, and fourth subpixels SP1, SP2, SP3, and SP4 may emit light of different colors. In other embodiments, at least two of the first, second, third, and fourth subpixels SP1, SP2, SP3, and SP4 may emit light of the same color. For example, the second and fourth emission areas GE1 and EG2 may emit light of the same color.

First emission areas BE, second emission areas GE1, third emission areas RE, and fourth emission areas GE2 may have a rectangular shape in a plan view, but the disclosure is not limited thereto. In other embodiments, the first emission areas BE, the second emission areas GE1, the third emission areas RE, and the fourth emission areas GE2 may have a non-tetragonal polygonal shape, a circular shape, or an elliptical shape in a plan view. Referring to FIG. 7, the first emission areas BE have a largest size, and the second emission areas GE1 and the fourth emission areas GE2 have the same, smallest size. However, the disclosure is not limited to this example.

The second emission areas GE1 and the fourth emission areas GE2 may be alternately arranged in the first direction (or the X-axis direction). The second emission areas GE1 may be arranged in the second direction (or the Y-axis direction). The fourth emission areas GE2 may be arranged in the second direction (or the Y-axis direction). Each of the fourth emission areas GE2 may have long sides in a fourth direction DR4 and short sides in a fifth direction DR5, and each of the second emission areas GE1 may have long sides in the fifth direction DR5 and short sides in the fourth direction DR4. The fourth direction DR4 may be a diagonal direction between the first direction (or the X-axis direction) and the second direction (or the Y-axis direction), and the fifth direction DR5 may be a direction intersecting the fourth direction DR4.

The first emission areas BE and the third emission areas RE may be alternately arranged in the first direction (or the X-axis direction). The first emission areas BE may be arranged in the second direction (or the Y-axis direction). The third emission areas RE may be arranged in the second direction (or the Y-axis direction). The first emission areas BE and the third emission areas RE may have a rhombus shape in a plan view. Each of the first emission areas BE may have a pair of sides that may be parallel to the fourth direction DR4 and a pair of sides that may be parallel to the fifth direction DR5, and each of the third emission areas RE may have a pair of sides that may be parallel to the fourth direction DR4 and a pair of sides that may be parallel to the fifth direction DR5.

Figure 8:
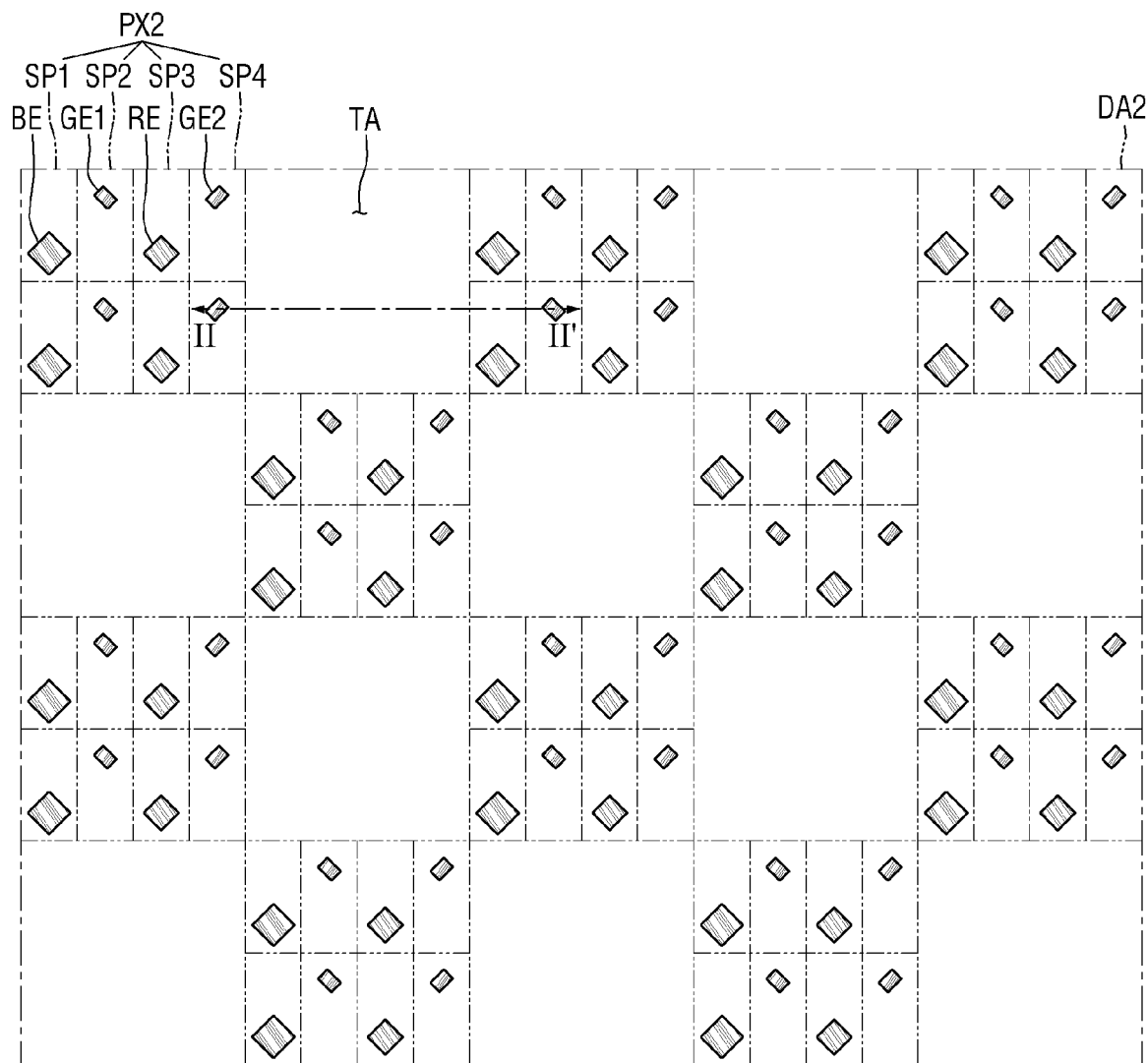
FIG. 8 is a schematic plan view illustrating pixels and transmissive areas in a second display area of the display panel of FIG. 3.

FIG. 8 is a schematic plan view illustrating pixels and transmissive areas in the second display area of the display panel of FIG. 3.

Referring to FIG. 8, the second display area DA2 of the display panel 100 may include second pixels PX2, which may be for displaying an image, and transmissive areas TA.

Each of the second pixels PX2 may include first, second, third, and fourth subpixels SP1, SP2, SP3, and SP4. The first, second, third, and fourth subpixels SP1, SP2, SP3, and SP4 may be substantially the same as their respective counterparts of FIG. 7, and thus, detailed descriptions thereof will be omitted.

The transmissive areas TA refer to areas that can transmit light therethrough. The second pixels PX2 may not be disposed in the transmissive areas TA. The number of second pixels PX2 per unit area of the second display area DA2 may be smaller than the number of first pixels PX1 per unit area of the first display area DAL Space for the arrangement of the transmissive areas TA can be secured in the second display area DA2 by reducing the number of second pixels PX2 in the second display area DA2.

The transmissive areas TA may be disposed adjacent to one another in the first direction (or the X-axis direction) and the second direction (or the Y-axis direction). The transmissive areas TA may be arranged in a zigzag fashion. Each of the transmissive areas TA may be surrounded by second pixels PX2.

Each of the transmissive areas TA may surround M second pixels PX2 (where M may be a positive integer). M second pixels PX2 may be arranged between a pair of adjacent transmissive areas TA in the first direction (or the X-axis direction). M second pixels PX2 may be arranged between a pair of adjacent transmissive areas TA in the second direction (or the Y-axis direction). For example, as illustrated in FIG. 8, each of the transmissive areas TA may surround two second pixels PX2, two second pixels PX2 may be arranged between a pair of adjacent transmissive areas TA in the first direction (or the X-axis direction), and two second pixels PX2 may be arranged between a pair of adjacent transmissive areas TA in the second direction (or the Y-axis direction). However, the disclosure is not limited to this example.

The second pixels PX2 and the transmissive areas TA may be alternately arranged in the first direction (or the X-axis direction). For example, the second pixels PX2 and the transmissive areas TA may be alternately arranged in the order of two second pixels PX2, a transmissive area TA, two second pixels PX2, and a transmissive area TA in the first direction (or the X-axis direction).

The second pixels PX2 and the transmissive areas TA may be alternately arranged in the second direction (or the Y-axis direction). For example, the second pixels PX2 and the transmissive areas TA may be alternately arranged in the order of two second pixels PX2, a transmissive area TA, two second pixels PX2, and a transmissive area TA in the second direction (or the Y-axis direction).

As illustrated in FIG. 8, by reducing the number of second pixels PX2 per unit area of the second display area DA2 below the number of first pixels PX1 per unit area of the first display area DA1, space for the arrangement of the transmissive areas TA can be secured in the second display area DA2. Accordingly, the second display area DA2 can transmit both light incident from the front of the display panel 100 and light incident from the rear of the display panel 100 therethrough through the transmissive areas TA.

Figure 9:
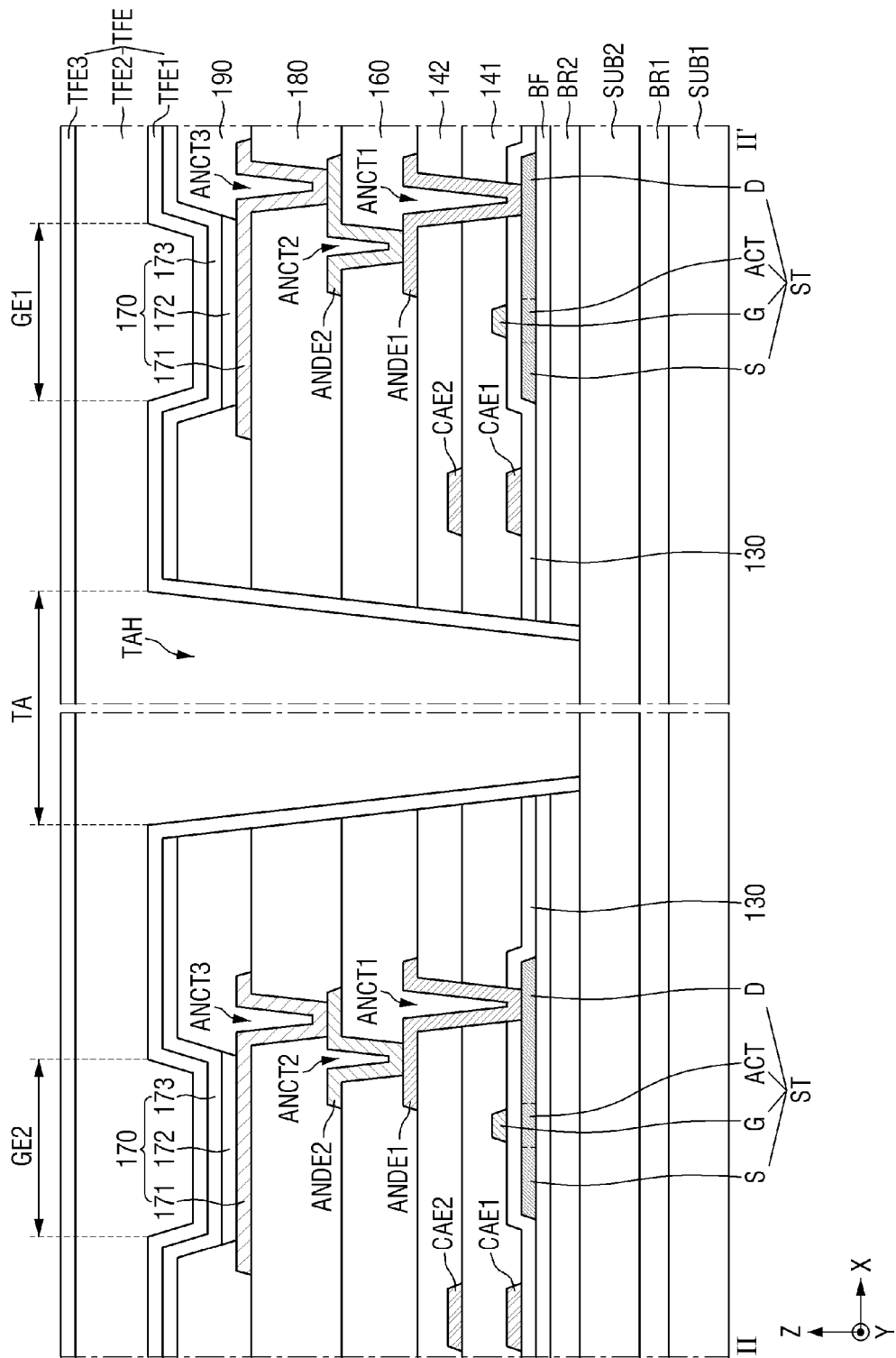
FIG. 9 is a schematic cross-sectional view taken along line II-IF of FIG. 8.

FIG. 9 is a schematic cross-sectional view taken along line II-IF of FIG. 8.

Referring to FIG. 9, a first barrier film BR1 may be disposed on a first substrate SUB1, a second substrate SUB2 may be disposed on the first barrier film BR1, and a second barrier film BR2 may be disposed on the second substrate SUB2.

The first and second substrates SUB1 and SUB2 may be formed of an insulating material such as a polymer resin. For example, the first and second substrates SUB1 and SUB2 may include polyimide. The first and second substrates SUB1 and SUB2 may be flexible substrates that may be bendable, foldable, or rollable.

The first and second barrier films BR1 and BR2 may be films for protecting thin-film transistors (TFTs ST) of a TFT layer and light-emitting layers 172 from any moisture that may infiltrate into the first and second substrates SUB1 and SUB2 that may be susceptible to moisture. Each of the first and second barrier films BR1 and BR2 may include inorganic films that may be alternately stacked on each other. For example, each of the first and second barrier films BR1 and BR2 may be formed as a multilayer film in which at least one of a silicon nitride layer, a silicon oxynitride layer, a silicon oxide layer, a titanium oxide layer, and an aluminum oxide layer may be alternately stacked on each other.

A buffer film BF may be disposed on the second barrier film BR2. The buffer film BF may consist of at least one inorganic film. For example, the buffer film BF may include at last one of a silicon nitride layer, a silicon oxynitride layer, a silicon oxide layer, a titanium oxide layer, and an aluminum oxide layer.

TFTs ST may be disposed on the buffer film BF. Each of the TFTs ST may include an active layer ACT, a gate electrode G, a source electrode s, and a drain electrode D.

The active layer ACT, the source electrode S, and the drain electrode D may be disposed on the buffer film BF. The active layer ACT may include polycrystalline silicon, monocrystalline silicon, low-temperature polycrystalline silicon, amorphous silicon, an oxide semiconductor, or a combination thereof. The source electrode S and the drain electrode D may include a silicon semiconductor or an oxide semiconductor doped with ions or impurities and may thus have conductivity. The active layer ACT may overlap the gate electrode G in the third direction (or the Z-axis direction), and the source electrode S and the drain electrode D may not overlap the gate electrode G in the third direction (or the Z-axis direction).

A gate insulating film 130 may be disposed on the active layer ACT, the source electrode S, and the drain electrode D. The gate insulating film 130 may be formed as an inorganic film such as, for example, a silicon nitride layer, a silicon oxynitride layer, a silicon oxide layer, a titanium oxide layer, or an aluminum oxide layer.

A gate electrode G and a first capacitor electrode CAE1 may be disposed on the gate insulating film 130. The gate electrode G may overlap the active layer ACT in the third direction (or the Z-axis direction). The first capacitor electrode CAE1 may overlap a second capacitor electrode CAE2 in the third direction (or the Z-axis direction). The gate electrode G and the first capacitor electrode CAE1 may be formed as single- or multilayer films including molybdenum (Mo), aluminum (Al), chromium (Cr), gold (Au), titanium (Ti), nickel (Ni), neodymium (Nd), copper (Cu), or an alloy thereof.

A first interlayer insulating film 141 may be disposed on the gate electrode G and the first capacitor electrode CAE1. The first interlayer insulating film 141 may be formed as an inorganic film such as, for example, a silicon nitride layer, a silicon oxynitride layer, a silicon oxide layer, a titanium oxide layer, or an aluminum oxide layer. The first interlayer insulating film 141 may include inorganic films.

The second capacitor electrode CAE2 may be disposed on the first interlayer insulating film 141. The second capacitor electrode CAE2 may overlap the first capacitor electrode CAE1 in the third direction (or the Z-axis direction). Since the first interlayer insulating film 141 has a dielectric constant, a capacitor may be formed by the first capacitor electrode CAE1, the second capacitor electrode CAE2, and the first interlayer insulating film 141, which may be disposed between the first and second capacitor electrodes CAE1 and CAE2. The second capacitor electrode CAE2 may be formed as a single- or multilayer film including Mo, Al, Cr, Au, Ti, Ni, Nd, Cu, or an alloy thereof.

A second interlayer insulating film 142 may be disposed on the second capacitor electrode CAE2. The second interlayer insulating film 142 may be formed as an inorganic film such as, for example, a silicon nitride layer, a silicon oxynitride layer, a silicon oxide layer, a titanium oxide layer, or an aluminum oxide layer. The second interlayer insulating film 142 may include inorganic films.

A first anode connecting electrode ANDE1 may be disposed on the second interlayer insulating film 142. The first anode connecting electrode ANDE1 may be electrically connected to the drain electrode D through a first anode contact hole ANCT1, which exposes the drain electrode D through the first and second interlayer insulating films 141 and 142. The first anode connecting electrode ANDE1 may be formed as a single- or multilayer film including Mo, Al, Cr, Au, Ti, Ni, Nd, Cu, or an alloy thereof.

A first organic film 160 for planarization may be disposed on the first anode connecting electrode ANDE1. The first organic film 160 may be formed as an organic film including an acrylic resin, an epoxy resin, a phenolic resin, a polyamide resin, or a polyimide resin.

A second anode connecting electrode ANDE2 may be disposed on the first organic film 160. The second anode connecting electrode ANDE2 may be electrically connected to the first anode connecting electrode ANDE1 through a second anode contact hole ANCT2, which exposes the first anode connecting electrode ANDE1 through the first organic film 160. The second anode connecting electrode ANDE2 may be formed as a single- or multilayer film including Mo, Al, Cr, Au, Ti, Ni, Nd, Cu, or an alloy thereof.

A second organic film 180 may be disposed on the second anode connecting electrode ANDE2. The second organic film 180 may be formed as an organic film including an acrylic resin, an epoxy resin, a phenolic resin, a polyamide resin, or a polyimide resin.

FIG. 9 illustrates that each of the TFTs ST may be a top-gate TFT in which the gate electrode G may be disposed above the active layer ACT, but the disclosure is not limited thereto. In other embodiments, each of the TFTs ST may be formed as a bottom-gate TFT in which the gate electrode G may be disposed below the active layer ACT or a double-gate TFT in which the gate electrode G may be disposed both above and below the active layer ACT.

A light-emitting element 170 and a bank 190 may be disposed on the second organic film 180. The light-emitting element 170 may include a first light-emitting electrode 171, a light-emitting layer 172, and a second light-emitting electrode 173.

The first light-emitting electrode 171 may be formed on the second organic film 180. The first light-emitting electrode 171 may be electrically connected to the second anode connecting electrode ANDE2 through a third anode contact hole ANCT3, which exposes the second anode connecting electrode ANDE2 through the second organic film 180.

In a top emission structure that emits light in a direction from the light-emitting layer 172 to the second light-emitting electrode 173, the first light-emitting electrode 171 may be formed of a metallic material with high reflectance such as a stack of Al and Ti (e.g., Ti/Al/Ti), a stack of Al and indium tin oxide (ITO) (e.g., ITO/Al/ITO), a silver (Ag)-palladium (Pd)-copper (Cu) (APC) alloy, or a stack of an APC alloy and ITO (e.g., ITO/APC/ITO).

The bank 190 may be formed to partition the first light-emitting electrode 171 over the second organic film 180 and thus to define an emission area BE, GE1, RE, or GE2. The bank 190 may be formed to cover the edges of the first light-emitting electrode 171. The bank 190 may be formed as an organic film including an acrylic resin, an epoxy resin, a phenolic resin, a polyamide resin, or a polyimide resin.

The emission area BE, GE1, RE, or GE2 refers to an area where the first light-emitting electrode 171, the light-emitting layer 172, and the second light-emitting electrode 173 may be sequentially stacked on each other so that holes from the first light-emitting electrode 171 and electrons from the second light-emitting electrode 173 may recombine together in the light-emitting layer 172 to emit light.

For convenience, FIG. 8 illustrates only second and fourth emission areas GE1 and GE2. First and third emission areas BE and RE may be formed in a similar manner to the second and fourth emission areas GE1 and GE2 of FIG. 8, and thus, detailed descriptions thereof will be omitted.

The light-emitting layer 172 may be formed on the first light-emitting electrode 171 and the bank 190. The light-emitting layer 172 may include an organic material and may emit light of a particular color. For example, the light-emitting layer 172 may include a hole transport layer, an organic material layer, and an electron transport layer.

The second light-emitting electrode 173 may be formed on the light-emitting layer 172. The second light-emitting electrode 173 may be formed to cover the light-emitting layer 172. The second light-emitting electrode 173 may be a common layer formed in common in all emission areas BE, GE1, RE, and GE2. A capping layer may be formed on the second light-emitting electrode 173.

In the top emission structure, the second light-emitting electrode 173 may be formed of a transparent conductive oxide (TCO) material such as ITO or indium zinc oxide (IZO) or a semitransparent metallic material such as magnesium (Mg), Ag, or an alloy thereof. In a case where the second light-emitting electrode 173 may be formed of a semi-transmissive metallic material, emission efficiency can be improved due to micro-cavities.

An encapsulation layer TFE may be disposed on the second light-emitting electrode 173. The encapsulation layer TFE may include at least one inorganic film to prevent the penetration of oxygen or moisture into the light-emitting element layer. The encapsulation layer TFE may also include at least one organic film to protect the light-emitting element layer from foreign materials such as dust. For example, the encapsulation layer TFE may include a first inorganic film TFE1, an organic film TFE2, and a second inorganic film TFE3.

The first inorganic film TFE1 may be disposed on the second light-emitting electrode 173, the organic film TFE2 may be disposed on the first inorganic film TFE1, and the second inorganic film TFE3 may be disposed on the organic film TFE2. The first and second inorganic films TFE1 and TFE3 may be formed as multilayer films in which at least one of a silicon nitride layer, a silicon oxynitride layer, a silicon oxide layer, a titanium oxide layer, and an aluminum oxide layer may be alternately stacked on each other. The organic film TFE2 may include a monomer.

A through hole TAH, which exposes the second substrate SUB2 through the second barrier film BR2, the buffer film BF, the gate insulating film 130, the first interlayer insulating film 141, the second interlayer insulating film 142, the first organic film 160, the second organic film 180, and the bank 190, may be formed in each of the transmissive areas TA. The through hole TAH may be filled with the organic film TFE2 of the encapsulation layer TFE. The organic film TFE2 of the encapsulation layer TFE may be in contact with the second substrate SUB2.

In other embodiments, the first inorganic film TFE1 of the encapsulation layer TFE may be disposed on side surfaces of the second barrier film BR2, side surfaces of the buffer film BF, side surfaces of the gate insulating film 130, side surfaces of the first interlayer insulating film 141, side surfaces of the second interlayer insulating film 142, side surfaces of the first organic film 160, side surfaces of the second organic film 180, and side surfaces of the bank 190, exposed by the through hole TAH, to improve an encapsulation effect.

In yet other embodiments, the first inorganic film TFE1 of the encapsulation layer TFE may not cover the side surfaces of the second barrier film BR2, side surfaces of the buffer film BF, side surfaces of the gate insulating film 130, side surfaces of the first interlayer insulating film 141, side surfaces of the second interlayer insulating film 142, side surfaces of the first organic film 160, side surfaces of the second organic film 180, and side surfaces of the bank 190, exposed by the through hole TAH. The first inorganic film TFE1 of the encapsulation layer TFE may be disposed on the bank 190.

As illustrated in FIG. 9, a through hole TAH, which exposes the second substrate SUB2 through the second barrier film BR2, the buffer film BF, the gate insulating film 130, the first interlayer insulating film 141, the second interlayer insulating film 142, the first organic film 160, the second organic film 180, and the bank 190, may be formed in each of the transmissive areas TA. As a result, light incident from the front of the display panel 100 can travel toward the rear of the display panel 100 through the transmissive areas TA, and light incident from the rear of the display panel 100 can travel toward the front of the display panel 100 through the transmissive areas TA.

In a case where the first organic film 160, the second organic film 180, and the bank 190 may be formed of polyimide, which has a high absorption coefficient for short-wavelength light such as blue light, the first organic film 160, the second organic film 180, and the bank 190 can absorb short-wavelength light. Thus, if the first organic film 160, the second organic film 180, and the bank 190, which may be formed of polyimide, may be removed from the transmissive areas TA, short-wavelength light can be prevented from being removed from light incident upon the camera sensor 710. The light incident upon the camera sensor 710 can be prevented from being distorted by the first organic film 160, the second organic film 180, and the bank 190.

Figure 10:
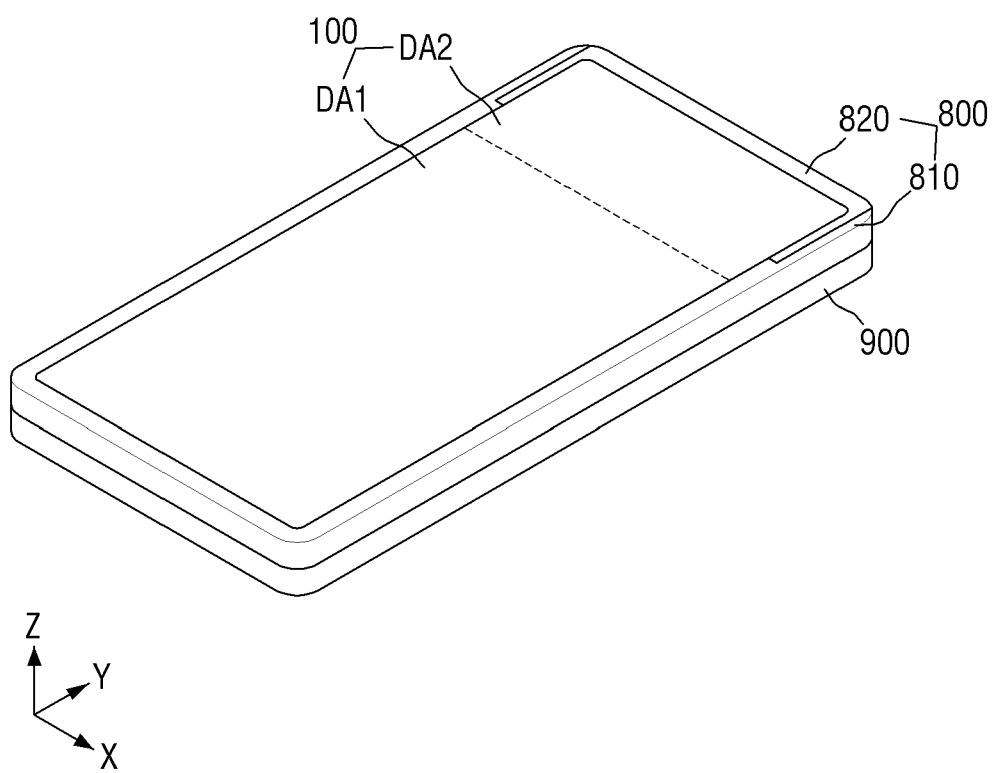
FIGS. 10 and 11 are schematic perspective views of a display device according to another embodiment of the disclosure.
Figure 11:
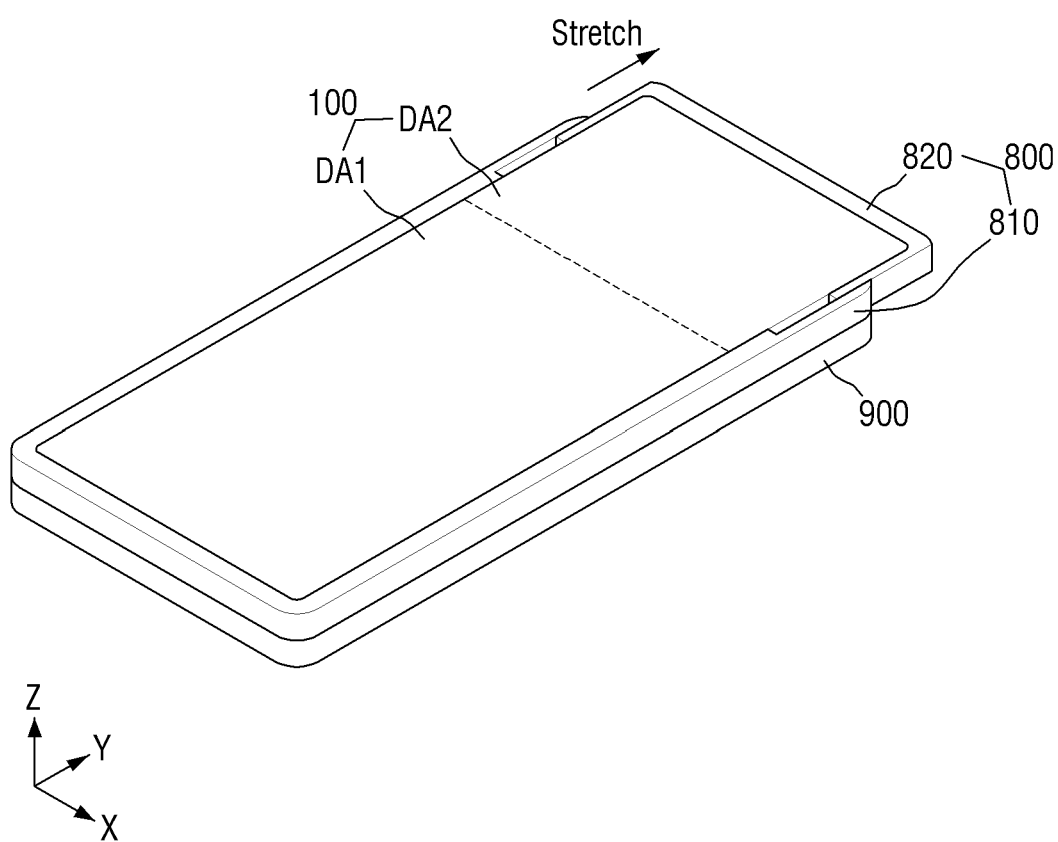

FIGS. 10 and 11 are schematic perspective views of a display device according to another embodiment of the disclosure.

The embodiment of FIGS. 10 and 11 differs from the embodiment of FIGS. 1 and 2 in that first and second supporting members 810 and 820 of a supporting member 800, instead of the supporting member 800 and a lower member 900, slidably move relative to each other so that a second display area DA2 on one edge of a display panel 100 can protrude beyond the lower member 900 in one direction. The embodiment of FIGS. 10 and 11 will hereinafter be described, focusing on the differences with the embodiment of FIGS. 1 and 2.

Referring to FIGS. 10 and 11, the supporting member 800 may be extended to, and support, the display panel 100. The supporting member 800 may surround four side surfaces of the display panel 100. The supporting member 800 may be formed as a rectangular frame, but the disclosure is not limited thereto.

The supporting member 800 may include the first and second supporting members 810 and 820. The first supporting member 810 may be extended to, and support and fix, a first display area DA1 of the display panel 100. The first supporting member 810 may be disposed to surround the left, right, and lower side surfaces of the display panel 100. The first supporting member 810 may be attached to the left, right, and lower side surfaces of the display panel 100 via an adhesive member such as a pressure sensitive adhesive.

The first supporting member 810 may be extended to the lower member 900. The first supporting member 810 may be attached to the lower member 900 via an adhesive member such as a pressure sensitive adhesive or may be coupled to the lower member 900 via a fixing member such as screws.

The second supporting member 820 may be extended to, and support, the second display area DA2 of the display panel 100. The second supporting member 820 may be disposed on the upper side surface of the display panel 100 and on parts of the left and right side surfaces of the display panel 100 that may be adjacent to the upper side surface of the display panel 100. The second supporting member 820 may be attached to the upper side surface of the display panel 100 via an adhesive member such as a pressure sensitive adhesive.

The first and second supporting members 810 and 820 may both be disposed on the parts of the left and right side surfaces of the display panel 100 that may be adjacent to the upper side surface of the display panel 100. Thus, the widths of the first and second supporting members 810 and 820 may be smaller on the parts of the left and right side surfaces of the display panel 100 that may be adjacent to the upper side surface of the display panel 100 than on the other parts of the left and right side surfaces of the display panel 100. For example, the sum of the widths of the first and second supporting members 810 and 820 on the parts of the left and right side surfaces of the display panel 100 that may be adjacent to the upper side surface of the display panel 100 may be substantially the same as the widths of the first supporting member 810 on the other parts of the left and right side surfaces of the display panel 100.

Figure 13A:
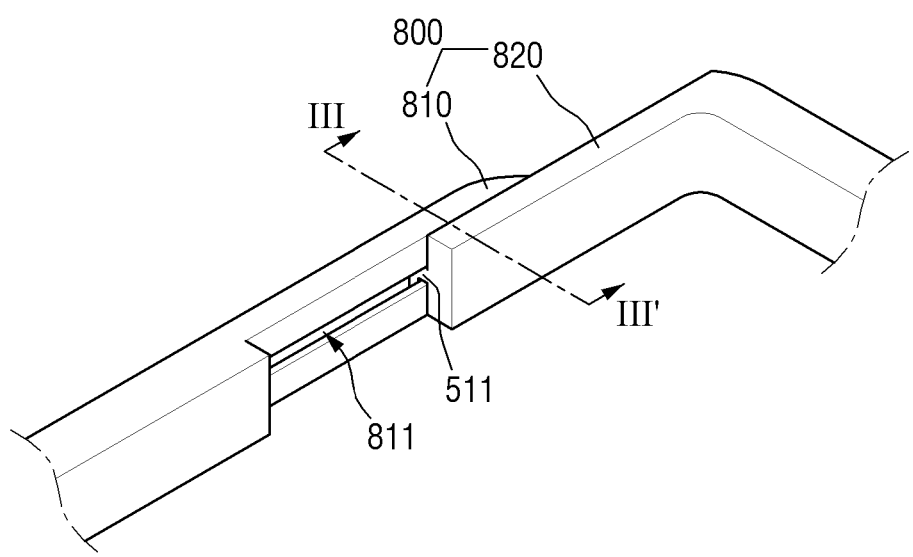
FIG. 13A is a schematic perspective view illustrating a first supporting member, a second slide module, and a second supporting member.
Figure 13B:
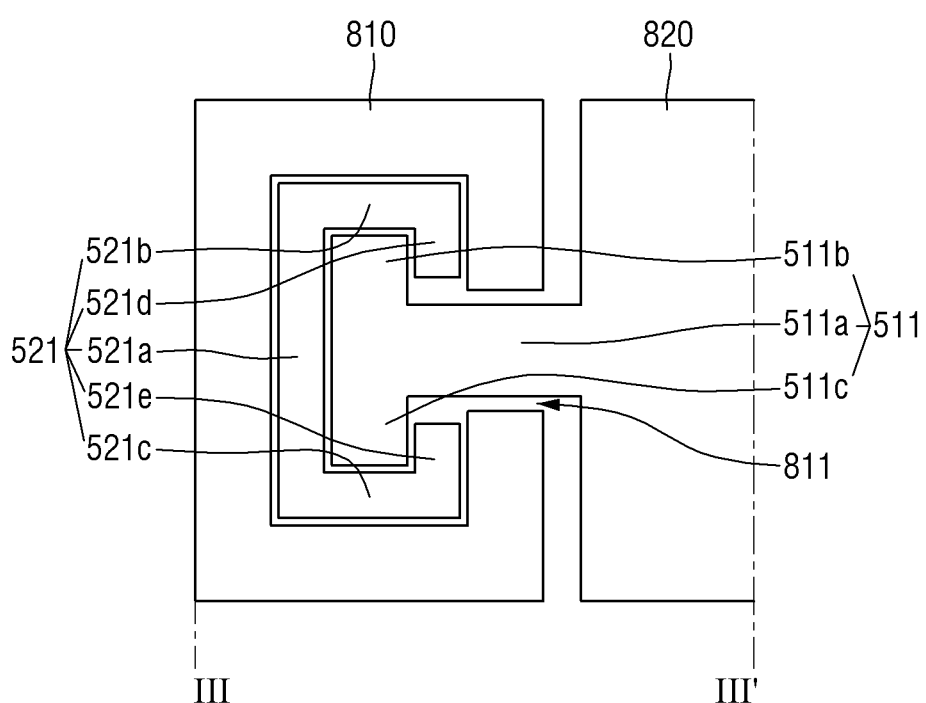
FIG. 13B is a schematic cross-sectional view taken along line of FIG. 13A.

The second supporting member 820 may be extended to the first supporting member 810 via a second slide module (500 of FIG. 13B). As a result, as illustrated in FIG. 11, the first and second supporting members 810 and 820 may slidably move relative to each other in the second direction (or the Y-axis direction) due to the second slide module (500 of FIG. 13B). The second supporting member 820 may move, and thereby protrude beyond, the lower member 900 in the second direction (or the Y-axis direction) due to the second slide module (500 of FIG. 13B).

In other embodiments, the first and second supporting members 810 and 820 may slidably move relative to each other in the first direction (or the X-axis direction) due to the second slide module (500 of FIG. 13B). The second supporting member 820 may move, and thereby protrude beyond, the lower member 900 in the first direction (or the X-axis direction) due to the second slide module (500 of FIG. 13B).

In a case where the first and second supporting members 810 and 820 may slidably move relative to each other in the second direction (or the Y-axis direction) due to the second slide module (500 of FIG. 13B), one side of the second supporting member 820 may protrude beyond one side of the lower member 900 due to the second slide module (500 of FIG. 13B). For example, as illustrated in FIG. 11, the upper side of the second supporting member 820 may protrude beyond the upper side of the lower member 900 due to the second slide module (500 of FIG. 13B), but the disclosure is not limited thereto. In another example, in a case where the first and second supporting members 810 and 820 slidably move relative to each other in the first direction (or the X-axis direction) due to the second slide module (500 of FIG. 13B), the left or right side of the second supporting member 820 may protrude beyond the left or right side of the lower member 900 due to the second slide module (500 of FIG. 13B).

The second slide module (500 of FIG. 13B) may be disposed to be hidden from view from the outside, as illustrated in FIGS. 10 and 11. The second slide module (500 of FIG. 13B) will be described later in detail with reference to FIGS. 13A and 13B.

The second display area DA2 of the display panel 100 may include cutout patterns and may thus be stretchable. In a case where the second supporting member 820 protrudes beyond the lower member 900 due to the second slide module (500 of FIG. 13B), the second display area DA2 of the display panel 100 may be stretched. The size of the second display area DA2 may be greater in case stretched than in case not stretched. The second display area DA2 of the display panel 100 will be described later in detail with reference to FIGS. 15 and 16.

As illustrated in FIGS. 10 and 11, in a case where the first and second supporting members 810 and 820 slidably move relative to each other in one direction due to the second slide module (500 of FIG. 13B), the second supporting member 820 may protrude beyond the lower member 900 in the direction where the first and second supporting members 810 and 820 slidably move relative to each other, due to the second slide module (500 of FIG. 13B). Since the second display area DA2 may be extended to the second supporting member 820, the second display area DA2 may be stretched along the moving direction of the second supporting member 820. Accordingly, part of the second display area DA2 on one edge of the display panel 100 may protrude beyond the lower member 900 in the direction where the first and second supporting members 810 and 820 slidably move relative to each other. Therefore, the user can see not only the background at the rear of the display device 10 through the transmissive areas of the second display area DA2, but also a virtual image displayed in the second display area DA2, at the same time. Since a real image and a virtual image can be superimposed on each other in the second display area DA2, the display device 10 can provide the user with augmented reality.

Figure 12:
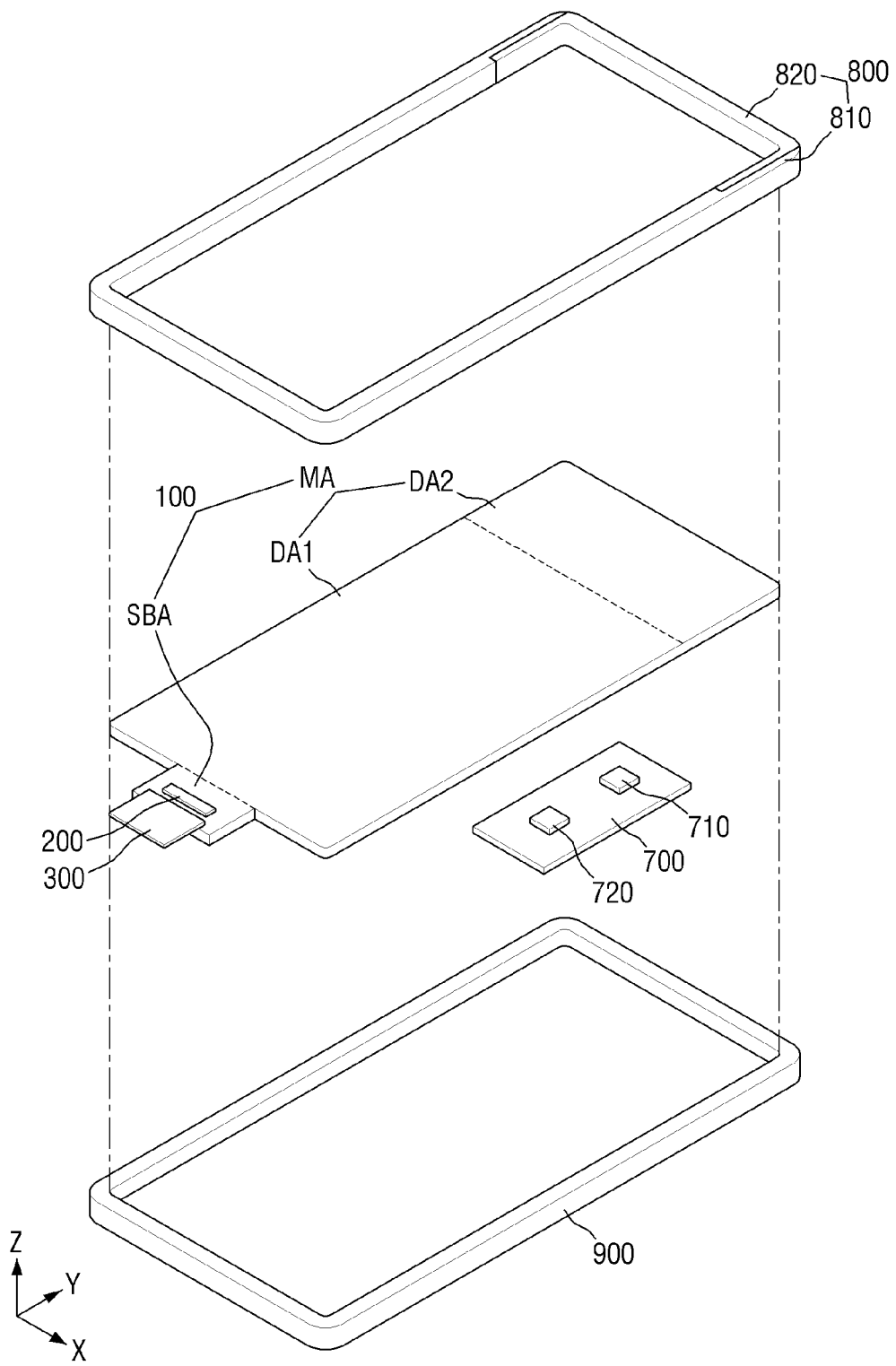
FIG. 12 is an exploded schematic perspective view of a display device according to another embodiment of the disclosure.

FIG. 12 is an exploded schematic perspective view of a display device according to another embodiment of the disclosure.

The embodiment of FIG. 12 differs from the embodiment of FIG. 3 in that a display device 10 does not include a first slide module 400, and that a supporting member 800 includes first and second supporting members 810 and 820. The first and second supporting members 810 and 820 may be almost the same as already been described above with reference to FIGS. 10 and 11, and thus, a detailed description of the embodiment of FIG. 12 will be omitted.

FIG. 13A is a schematic perspective view illustrating a first supporting member, a second slide module, and a second supporting member. FIG. 13B is a schematic cross-sectional view taken along line of FIG. 13A.

For convenience, FIGS. 13A and 13B illustrate only a third slide protrusion 511 and a third slide rail 521 of a second slide module 500 and a third slide groove 811 of a first supporting member 810.

Referring to FIGS. 13A and 13B, the third slide protrusion 511 may include a third extended portion 511a, a third protrusion inserting portion 511b, and a fourth protrusion inserting portion 511c. The third slide rail 521 may include a third bottom portion 521a, a third sidewall portion 521b, a fourth sidewall portion 521c, a third protrusion portion 521d, and a fourth protrusion portion 521e.

The third extended portion 511a may extend in a second direction (or the Y-axis direction). The left side of the third extended portion 511a may be adjacent to the third bottom portion 521a of the third slide rail 521. The right side of the third extended portion 511a may be extended to the outer left side surface of a second supporting member 820.

The third protrusion inserting portion 511b may protrude from a side of the left end of the third extended portion 511a in a third direction (or the Z-axis direction). The third protrusion inserting portion 511b may extend from the left end of the third extended portion 511a in an upward direction.

The fourth protrusion inserting portion 511c may extend from another side of the left end of the third extended portion 511a in the third direction (or the Z-axis direction). The fourth protrusion inserting portion 511c may extend from the left end of the third extended portion 511a in a downward direction.

The third sidewall portion 521b may protrude from the upper end of the third bottom portion 521a in a first direction (or an X-axis direction). The third sidewall portion 521b may protrude from the upper end of the third bottom portion 521a in a rightward direction. The third protruding portion 521d may protrude from the right end of the third sidewall portion 521b in the third direction (or the Z-axis direction). The third protruding portion 521d may protrude from the right end of the third sidewall portion 521b in the downward direction. Accordingly, the third bottom portion 521a, the third sidewall portion 521b, and the third protruding portion 521d of the third slide rail 521 may form a "C"- or bracket "C"-shaped space. Thus, the third protrusion inserting portion 511b may be inserted in the "C"- or bracket "C"-shaped space formed by the third bottom portion 521a, the third sidewall portion 521b, and the third protruding portion 521d of the third slide rail 521.

The fourth sidewall portion 521c may protrude from the lower end of the third bottom portion 521a in the first direction (or the X-axis direction). The fourth sidewall portion 521c may protrude from the lower end of the third bottom portion 521a in the rightward direction. The fourth protruding portion 521e may protrude from the right end of the fourth sidewall portion 521c in the third direction (or the Z-axis direction). The fourth protruding portion 521e may protrude from the right end of the fourth sidewall portion 521c in the upward direction. Accordingly, the third bottom portion 521a, the fourth sidewall portion 521c, and the fourth protruding portion 521e of the third slide rail 521 may form a "C"- or bracket "C"-shaped space. Thus, the fourth protrusion inserting portion 511c may be inserted in the "C"- or bracket "C"-shaped space formed by the third bottom portion 521a, the fourth sidewall portion 521c, and the fourth protruding portion 521e of the third slide rail 521.

The third slide groove 811 may be formed on part of the inner surface of a left part of the first supporting member 810, particularly, part of the inner surface of the left part of the first supporting member 810 that faces the second supporting member 820. The length, in the third direction (or the Z-axis direction), of the third slide rail 521, which may be disposed at the bottom of the third slide groove 811, may be greater than the length, in the third direction (or the Z-axis direction), of the third slide protrusion 511, which may be disposed at the entrance of the third slide groove 811. Accordingly, the third slide groove 811 may have a wider bottom than its entrance. The length, in the third direction (or the Z-axis direction), of the entrance of the third slide groove 811 may be smaller than the length, in the third direction (or the Z-axis direction), of the bottom of the third slide groove 811.

As illustrated in FIGS. 13A and 13B, the third protrusion inserting portion 511b of the third slide protrusion 511 may be inserted in the "C"- or bracket "C"-shaped space formed by the third bottom portion 521a, the third sidewall portion 521b, and the third protruding portion 521d of the third slide rail 521, and the fourth protrusion inserting portion 511c of the third slide protrusion 511 may be inserted in the "C"- or bracket "C"-shaped space formed by the third bottom portion 521a, the fourth sidewall portion 521c, and the third protruding portion 521e of the third slide rail 521c, and the fourth protruding portion 521e. Thus, the third slide protrusion 511a can slidably move in the second direction (or the Y-axis direction) due to the third slide rail 521.

A fourth slide groove, in which a fourth slide rail may be disposed, may be formed on part of the inner surface of a right part of the first supporting member 810, particularly, part of the inner surface of the right part of the first supporting member 810 that faces the second supporting member 820. A fourth slide protrusion may be extended to the outer surface of a right part of the second supporting member 820 and the fourth slide rail in the fourth slide groove. The fourth slide protrusion, the fourth slide rail, and the fourth slide groove of the second slide module 500 may be substantially the same as their respective counterparts of FIGS. 13A and 13B, and thus detailed descriptions thereof will be omitted.

Figure 14:
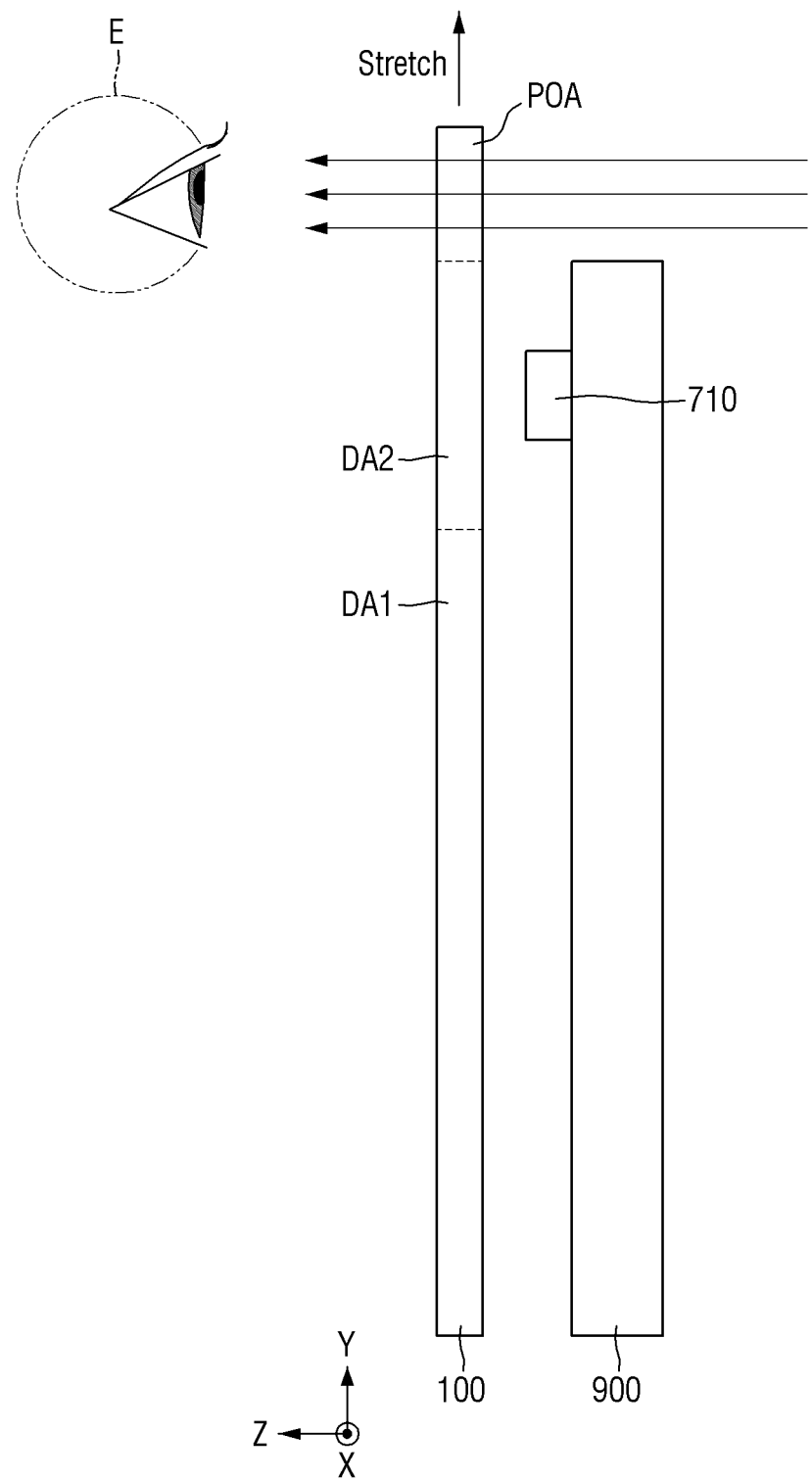
FIG. 14 is a schematic side view illustrating a display panel, a camera sensor, and a lower member of FIG. 12.

FIG. 14 is a schematic side view illustrating the display panel, the camera sensor, and the lower member of FIG. 12.

FIG. 14 illustrates that due to the slidable movement by the second slide module 500, the second display area DA2 of the display panel 100 may be stretched in the second direction (or the Y-axis direction) so that part of the second display area DA2, i.e., a partial area POA, protrudes beyond the lower member 900. Referring to FIG. 14, the main circuit board 700 may be disposed in the storage space AS of the lower member 900, and the camera sensor 710 may be disposed to protrude beyond the lower member 900 in the third direction (or the Z-axis direction). However, the disclosure is not limited to this example.

As illustrated in FIG. 14, in case that the partial area POA of the second display area DA2 of the display panel 100 slidably moves and thereby protrudes beyond the lower member 900 in the second direction (or the Y-axis direction), the partial area POA of the second display area DA2 may not overlap the lower member 900 in the third direction (or the Z-axis direction). Thus, light incident from the rear of the display device 10 can be incident upon the eye E of the user at the front of the display device 10 through the transmissive areas in the partial area POA of the second display area DA2. Even though the eye E of the user may overlap the display panel 100 in the third direction (or the Z-axis direction), the eye E of the user can see the background at the rear of the display device 10 through the transmissive areas of the partial area POA of the second display area DA2. Therefore, the user can see not only the background at the rear of the display device 10 through the transmissive areas of the second display area DA2, but also a virtual image displayed in the second display area DA2. In other words, since a real image and a virtual image can be superimposed on each other in the partial area POA of the second display area DA2, the display device 10 can provide the user with augmented reality.

Figure 15:
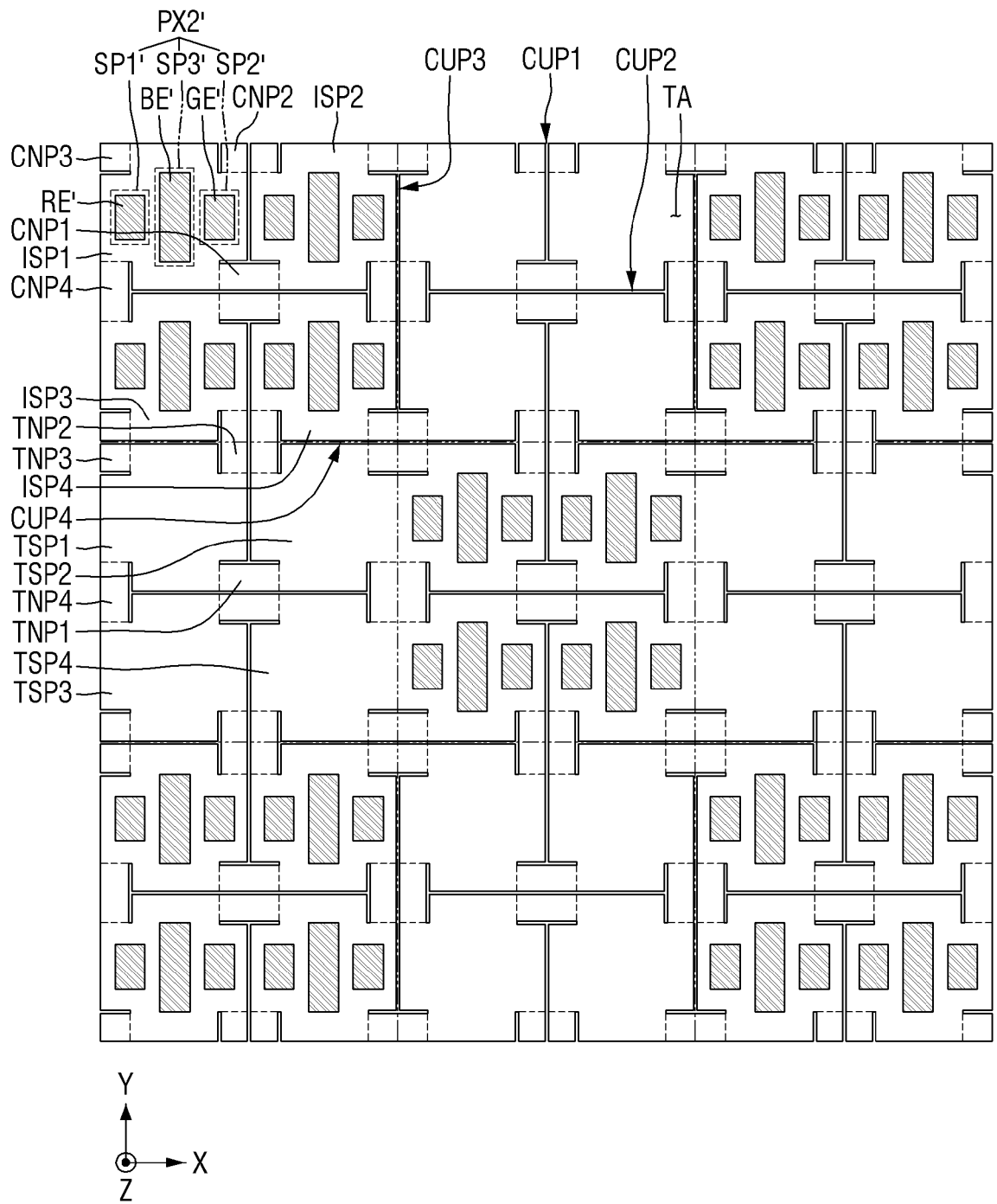
FIGS. 15 and 16 are schematic plan views illustrating pixels and transmissive areas in a second display area of a display panel.
Figure 16:
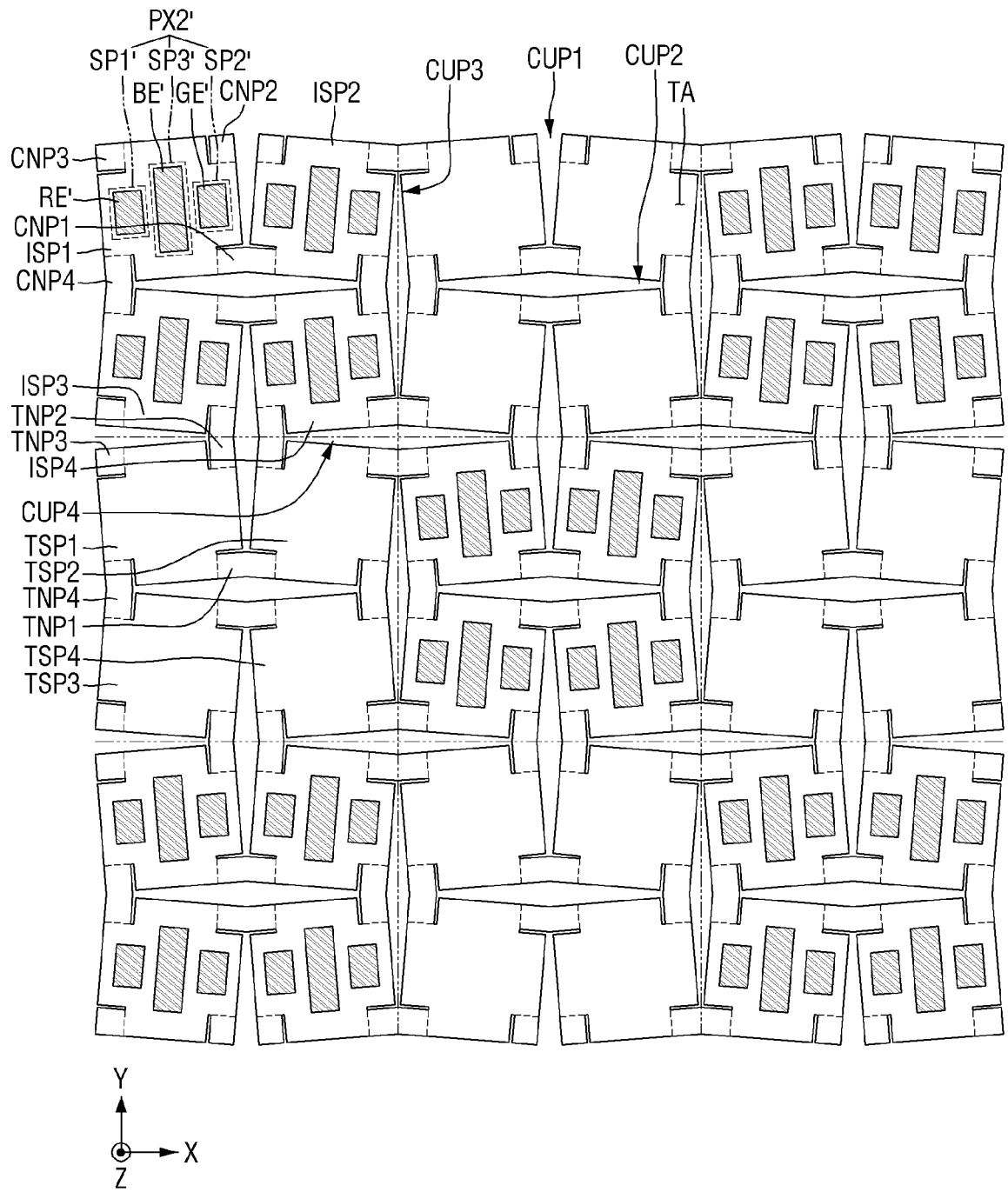

FIGS. 15 and 16 are schematic plan views illustrating pixels and transmissive areas in a second display area of a display panel.

Referring to FIGS. 15 and 16, a second display area DA2 may include island patterns ISP1, ISP2, ISP3, and ISP4, connecting patterns CNP1, CNP2, CNP3, and CNP4, transmissive patterns TSP1, TSP2, TSP3, and TSP4, transmissive connecting patterns TNP1, TNP2, TNP3, and TNP4, and cutout patterns CUP1, CUP2, CUP3, and CUP4.

First cutout patterns CUP1, second cutout patterns CUP2, third cutout patterns CUP3, and fourth cutout patterns CUP4 may be regions where a display panel 100 may be cut out. For example, the first cutout patterns CUP1, the second cutout patterns CUP2, the third cutout patterns CUP3, and the fourth cutout patterns CUP4 may be regions where first and second substrates SUB1 and SUB2 of the display panel 100 may be cut out.

First island patterns ISP1, second island patterns ISP2, third island patterns ISP3, and fourth island patterns ISP4 may be isolated from one another by the first cutout patterns CUP1, the second cutout patterns CUP2, the third cutout patterns CUP3, and the fourth cutout patterns CUP4. For example, the first cutout patterns CUP1 may be disposed between the first island patterns ISP1 and the second island patterns ISP2 so that the first island patterns ISP1 and the second island patterns ISP2 may be spaced apart in a first direction (or an X-axis direction). For example, the second cutout patterns CUP2 may be disposed between the first island patterns ISP1 and the third island patterns ISP3 so that the first island patterns ISP1 and the third island patterns ISP3 may be spaced apart in a second direction (or a Y-axis direction). For example, the second cutout patterns CUP2 may be disposed between the second island patterns ISP2 and the fourth island patterns ISP4 so that the second island patterns ISP2 and the fourth island patterns ISP4 may be spaced apart in the second direction (or the Y-axis direction). For example, the first cutout patterns CUP1 may be disposed between the third island patterns ISP3 and the fourth island patterns ISP4 so that the third island patterns ISP3 and the fourth island patterns ISP4 may be spaced apart in the first direction (or the X-axis direction).

First connecting patterns CNP1, second connecting patterns CNP2, third connecting patterns CNP3, and fourth connecting patterns CNP4 may extend from the first island patterns ISP1, the second island patterns ISP2, the third island patterns ISP3, and the fourth island patterns ISP4, respectively. The arrangement of the first connecting patterns CNP1, the second connecting patterns CNP2, the third connecting patterns CNP3, and the fourth connecting patterns CNP4 relative to, for example, the first island patterns ISP1, will hereinafter be described.

The first connecting patterns CNP1 may extend from the first island patterns ISP1 in the first direction (or the X-axis direction). The first connecting patterns CNP1 may connect the first island patterns ISP1 and the second island patterns ISP2.

The second connecting patterns CNP2 may extend from the first island patterns ISP1 in the second direction (or the Y-axis direction). The second connecting patterns CNP2 may connect the first island patterns ISP1 and third transmissive patterns TSP3.

The third connecting patterns CNP3 may extend from the first island patterns ISP1 in the first direction (or the X-axis direction). The third connecting patterns CNP3 may connect the first island patterns ISP1 and second transmissive patterns TSP2.

The fourth connecting patterns CNP4 may extend from the first island patterns ISP1 in the second direction (or the Y-axis direction). The fourth connecting patterns CNP4 may connect the first island patterns ISP1 and the third island patterns ISP3.

Second pixels PX2' may be disposed in the island patterns ISP1, ISP2, ISP3, and ISP4. Each of the second pixels PX2' may include first, second, and third subpixels SP1', SP2', and SP3'. The first, second, and third subpixels SP1', SP2', and SP3' may be arranged in the first direction (or the X-axis direction).

The first subpixel SP1' may include a first emission area RE', which emits light of a first color. The second subpixel SP2' may include a second emission area GE', which emits light of a second color. The third subpixel SP3' may include a third emission area BE', which emits light of a third color. For example, the first, second, and third colors may be red, green, and blue, respectively.

The first, second, and third emission areas RE', GE', and BE' may have a rectangular shape in a plan view, but the disclosure is not limited thereto. The first, second, and third emission areas RE', GE', and BE' may have a non-tetragonal polygonal shape, a circular shape, or an elliptical shape in a plan view, but the disclosure is not limited thereto. FIG. 15 illustrates that the third emission area BE' may be larger than the first and second emission areas RE' and GE', but the disclosure is not limited thereto. The first and second emission areas RE' and GE' may have the same size.

First transmissive patterns TSP1, the second transmissive patterns TSP2, the third transmissive patterns TSP3, and fourth transmissive patterns TSP4 may be disposed in transmissive areas TA. The second pixels PX2' may not be disposed in the transmissive patterns TSP1, TSP2, TSP3, and TSP4.

The first transmissive patterns TSP1, the second transmissive patterns TSP2, the third transmissive patterns TSP3, and the fourth transmissive patterns TSP4 may be spaced apart from one another. For example, the first cutout patterns CUP1 may be disposed between the first transmissive patterns TSP1 and the second transmissive patterns TSP2 so that the first transmissive patterns TSP1 and the second transmissive patterns TSP2 may be spaced apart in the first direction (or the X-axis direction). For example, the second cutout patterns CUP2 may be disposed between the first transmissive patterns TSP1 and the third transmissive patterns TSP3 so that the first transmissive patterns TSP1 and the third transmissive patterns TSP3 may be spaced apart in the second direction (or the Y-axis direction). For example, the second cutout patterns CUP2 may be disposed between the second transmissive patterns TSP2 and the fourth transmissive patterns TSP4 so that the second transmissive patterns TSP2 and the fourth transmissive patterns TSP4 may be spaced apart in the second direction (or the Y-axis direction). For example, the first cutout patterns CUP1 may be disposed between the third transmissive patterns TSP3 and the fourth transmissive patterns TSP4 so that the third transmissive patterns TSP3 and the fourth transmissive patterns TSP4 may be spaced apart in the first direction (or the X-axis direction).

Since the third cutout patterns CUP3 may be disposed between the first transmissive patterns TSP1 and the second island patterns ISP2, the first transmissive patterns TSP1 may be spaced apart from the second island patterns ISP2 in the first direction (or the X-axis direction). Since the third cutout patterns CUP3 may be disposed between the second transmissive patterns TSP2 and the first island patterns ISP1, the second transmissive patterns TSP2 may be spaced apart from the first island patterns ISP1 in the first direction (or the X-axis direction). Since the third cutout patterns CUP3 may be disposed between the third transmissive patterns TSP3 and the fourth island patterns ISP4, the third transmissive patterns TSP3 may be spaced apart from the fourth island patterns ISP4 in the first direction (or the X-axis direction). Since the third cutout patterns CUP3 may be disposed between the fourth transmissive patterns TSP4 and the third island patterns ISP3, the fourth transmissive patterns TSP4 may be spaced apart from the third island patterns ISP3 in the first direction (or the X-axis direction).

Since the fourth cutout patterns CUP4 may be disposed between the first transmissive patterns TSP1 and the third island patterns ISP3, the first transmissive patterns TSP1 may be spaced apart from the third island patterns ISP3 in the second direction (or the Y-axis direction). Since the fourth cutout patterns CUP4 may be disposed between the second transmissive patterns TSP2 and the fourth island patterns ISP4, the second transmissive patterns TSP2 may be spaced apart from the fourth island patterns ISP4 in the second direction (or the Y-axis direction). Since the fourth cutout patterns CUP4 may be disposed between the third transmissive patterns TSP3 and the first island patterns ISP1, the third transmissive patterns TSP3 may be spaced apart from the first island patterns ISP1 in the second direction (or the Y-axis direction). Since the fourth cutout patterns CUP4 may be disposed between the fourth transmissive patterns TSP4 and the second island patterns ISP2, the fourth transmissive patterns TSP4 may be spaced apart from the second island patterns ISP2 in the second direction (or the Y-axis direction).

First transmissive connecting patterns TNP1, second transmissive connecting patterns TNP2, third transmissive connecting patterns TNP3, and fourth transmissive connecting patterns TNP4 may extend from the first transmissive patterns TSP1, the second transmissive patterns TSP2, the third transmissive patterns TSP3, and the fourth transmissive patterns TSP4, respectively. The arrangement of the first transmissive connecting patterns TNP1, the second connecting transmissive patterns TNP2, the third transmissive connecting patterns TNP3, and the fourth transmissive connecting patterns TNP4 relative to, for example, the first transmissive patterns TSP1, will hereinafter be described.

The first transmissive connecting patterns TNP1 may extend from the first transmissive patterns TSP1 in the first direction (or the X-axis direction). The first transmissive connecting patterns TNP1 may connect the first transmissive patterns TSP1 and the second transmissive patterns TSP2.

The second transmissive connecting patterns TNP2 may extend from the first transmissive patterns TSP1 in the second direction (or the Y-axis direction). The second transmissive connecting patterns TNP2 may connect the first transmissive patterns TSP1 and the third island patterns ISP3.

The third transmissive connecting patterns TNP3 may extend from the first transmissive patterns TSP1 in the first direction (or the X-axis direction). The third transmissive connecting patterns TNP3 may connect the first transmissive patterns TSP1 and the second island patterns ISP2.

The fourth transmissive connecting patterns TNP4 may extend from the first transmissive patterns TSP1 in the second direction (or the Y-axis direction). The fourth transmissive connecting patterns TNP4 may connect the first transmissive patterns TSP1 and the third transmissive patterns TSP3.

As illustrated in FIGS. 15 and 16, the second display area DA2 may include: the island patterns ISP1, ISP2, ISP3, and ISP4 and the transmissive patterns TSP1, TSP2, TSP3, and TSP4, which may be spaced apart by the cutout patterns CUP1, CUP2, CUP3, and CUP4; and the connecting patterns CNP1, CNP2, CNP3, and CNP4 and the transmissive connecting patterns TNP1, TNP2, TNP3, and TNP4, which connect the island patterns ISP1, ISP2, ISP3, and ISP4 and the transmissive patterns TSP1, TSP2, TSP3, and TSP4. Thus, in case that the second display area DA2 may be stretched in the first direction (or the X-axis direction), the first cutout patterns CUP1 and the third cutout patterns CUP3 may open. Also, in case that the second display area DA2 may be stretched in the second direction (or the Y-axis direction), the second cutout patterns CUP2 may become apart from the fourth cutout patterns CUP4. Accordingly, the second display area DA2 can be stretched in both the first direction (or the X-axis direction) and the second direction (or the Y-axis direction).

Since the second pixels PX2' may not be disposed in the transmissive patterns TSP1, TSP2, TSP3, and TSP4 in the second display area DA2, the transmissive areas TA can transmit light therethrough. Thus, the second display area DA2 can transmit both light incident from the front of the display panel 100 and light incident from the rear of the display panel 100 therethrough through the transmissive areas TA.

Figure 17:
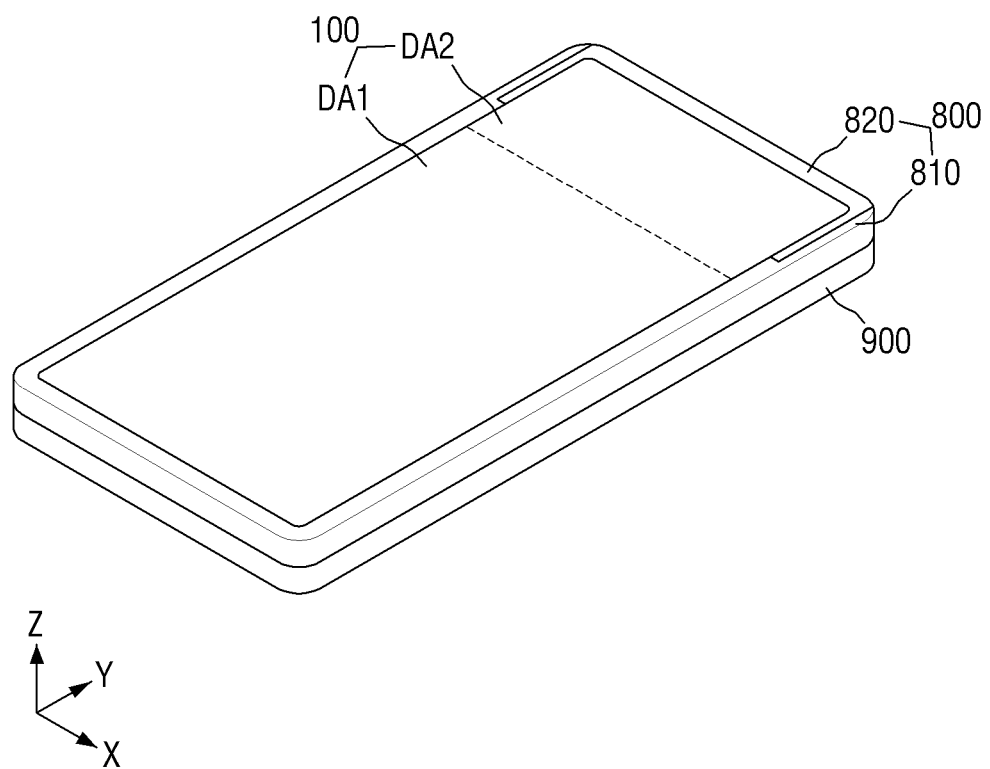
FIGS. 17 through 19 are schematic perspective views of a display device according to another embodiment of the disclosure.
Figure 18:
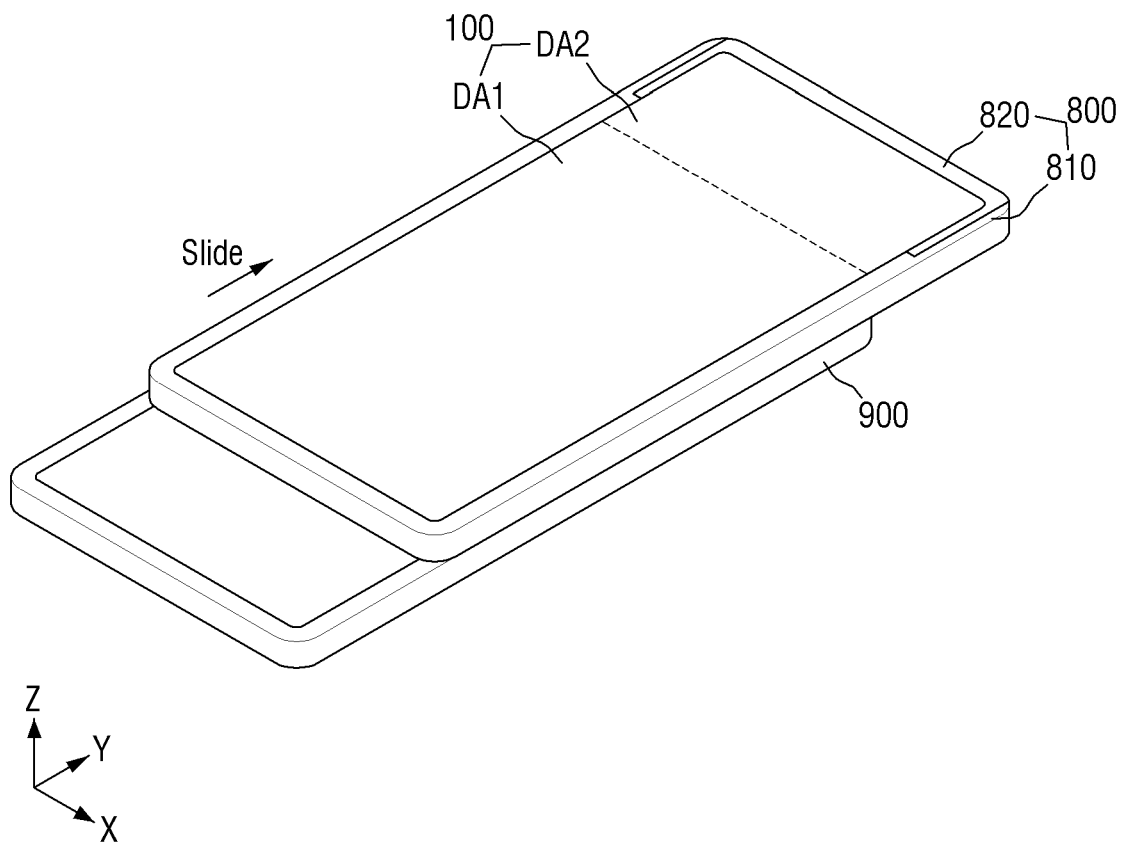
Figure 19:
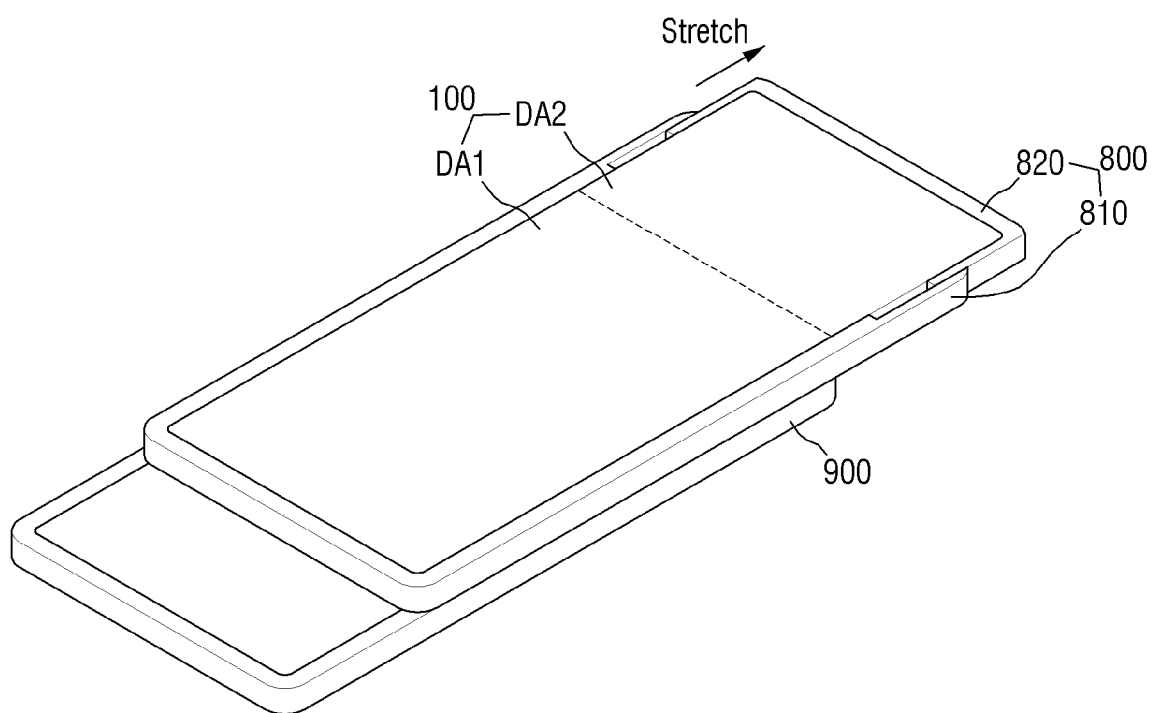

FIGS. 17 through 19 are schematic perspective views of a display device according to another embodiment of the disclosure.

The embodiment of FIGS. 17 through 19 differs from the embodiment of FIGS. 1 and 2 in that first and second supporting members 810 and 820 of a supporting member 800 slidably move relative to each other so that a second display area DA2 on one edge of a display panel 100 can protrude beyond the lower member 900 in one direction. In the embodiment of FIGS. 17 through 19, like in the embodiment of FIGS. 1 and 2, the supporting member 800 and the lower member 900 may slidably move relative to each other. In the embodiment of FIGS. 17 through 19, like in the embodiment of FIGS. 10 and 11, the first and second supporting members 810 and 820 of the supporting member 800 slidably move relative to each other so that the second display area DA2 on one edge of the display panel 100 can protrude beyond the lower member 900 in one direction.

Referring to FIG. 18, in a case where the supporting member 800 and the lower member 900 slidably move relative to each other in one direction due to a first slide module, the supporting member 800 may protrude beyond the lower member 900 in the direction where the supporting member 800 and the lower member 900 slidably move relative to each other, due to the first slide module. As a result, the second display area DA2 on one edge of the display panel 100 can protrude beyond the lower member 900 in the direction where the supporting member 800 and the lower member 900 slidably move relative to each other.

Referring to FIG. 19, in a case where the first and second supporting members 810 and 820 slidably move relative to each other in one direction due to a second slide module, the second supporting member 820 may protrude beyond the first supporting member 810 in the direction where the first and second supporting members 810 and 820 slidably move relative to each other, due to the second slide module. Since the second display area DA2 may be extended to the second supporting member 820, the second display area DA2 can be stretched in the direction where the second supporting member 820 moves.

In a case where the supporting member 800 protrudes beyond the lower member 900 due to the first slide module, as illustrated in FIG. 18, and the second supporting member 820 protrudes beyond the first supporting member 810 due to the second slide module, as illustrated in FIG. 19, the second display area DA2 can be further projected from the lower member 900 and can thus be further widened. In other words, the second display area DA2 of FIG. 19 may be wider than the second display area DA2 of FIG. 18. Also, the second display area DA2 of FIG. 19 may be much wider than the second display area DA2 of FIG. 11. Therefore, a display device 10 can provide a user with augmented reality over a wider area thereof.

Figure 20:
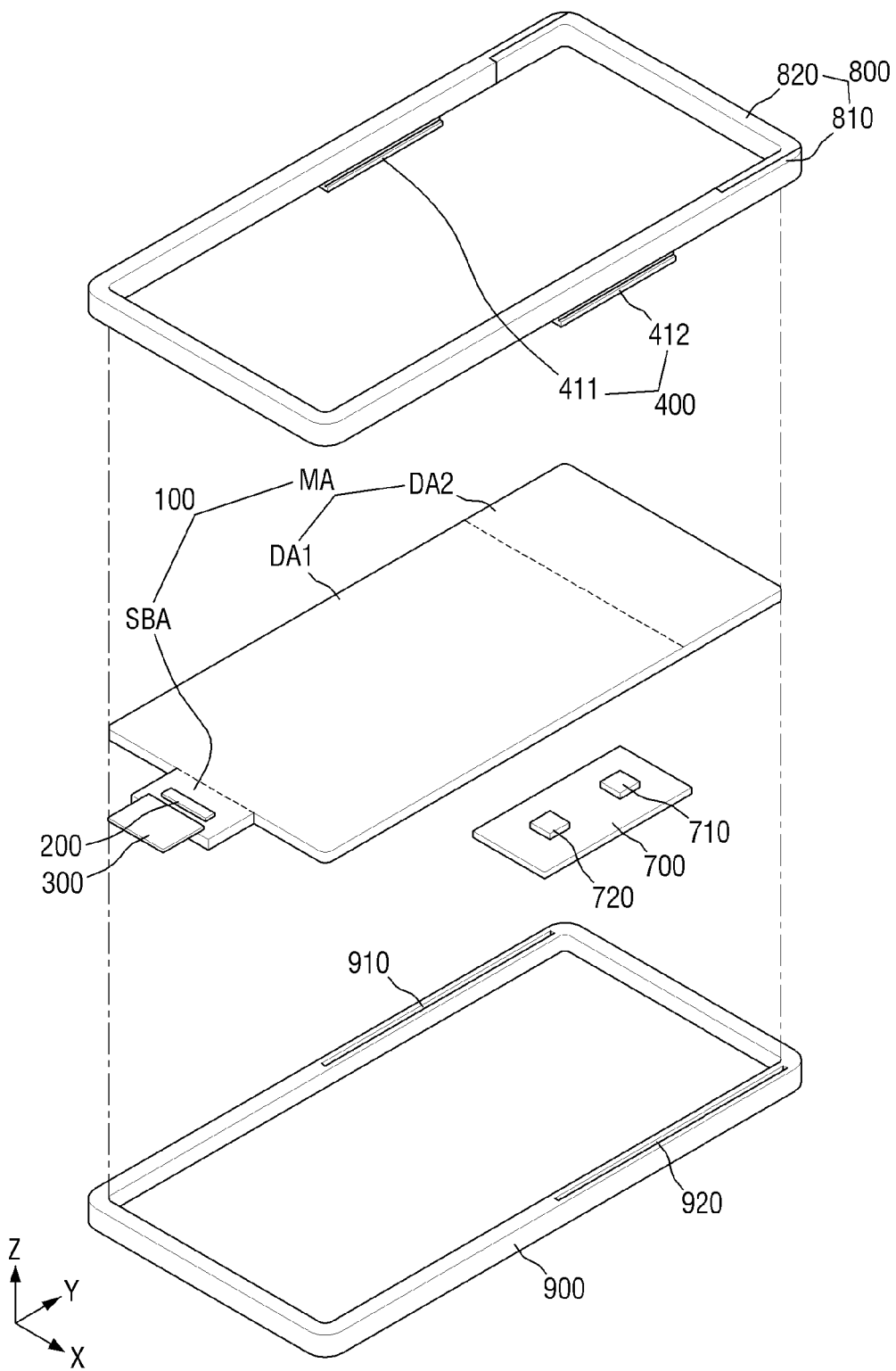
FIG. 20 is an exploded schematic perspective view of a display device according to another embodiment of the disclosure.

FIG. 20 is an exploded schematic perspective view of a display device according to another embodiment of the disclosure.

The embodiment of FIG. 20 differs from the embodiment of FIG. 3 in that a supporting member 800 includes first and second supporting members 810 and 820. The first and second supporting members 810 and 820 may be almost the same as described above with reference to FIGS. 10 and 11, and thus, detailed descriptions thereof will be omitted.

Figure 21:
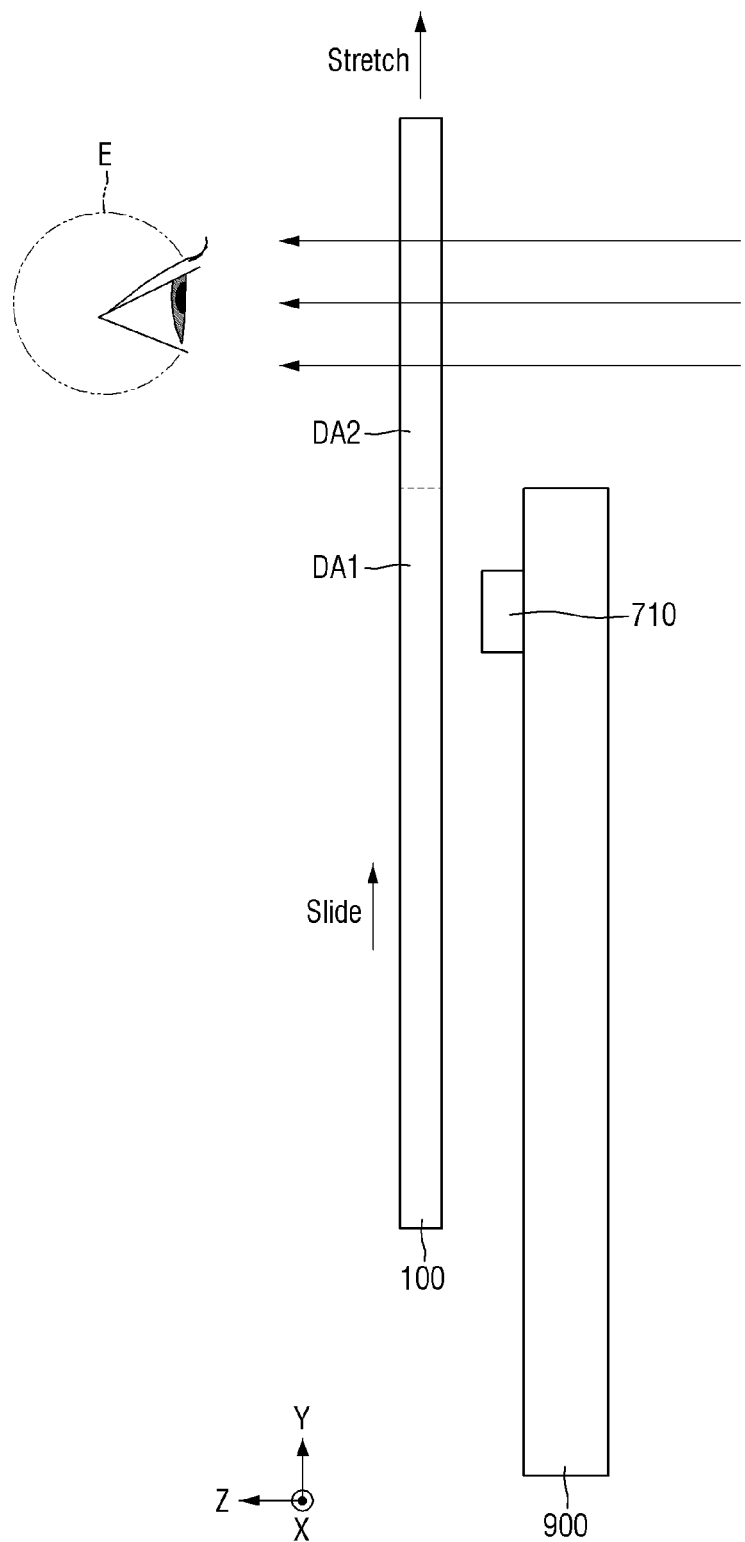
FIG. 21 is a schematic side view illustrating a display panel, a camera sensor, and a lower member of FIG. 20.

FIG. 21 is a schematic side view illustrating a display panel, a camera sensor, and a lower member of FIG. 20.

FIG. 21 illustrates that a second display area DA2 protrudes beyond a lower member 900 in a second direction (or a Y-axis direction) due to the slidable movement by a first slide module 400 and may be stretched in the second direction (or the Y-axis direction) due to the slidable movement by a second slide module 500. Referring to FIG. 21, a main circuit board 700 may be disposed in a storage space AS of the lower member 900, and a camera sensor 710 may be disposed to protrude beyond the lower member 900 in a third direction (or a Z-axis direction). However, the disclosure is not limited to this example.

As illustrated in FIG. 21, in case that the second display area DA2 of the display panel 100 slidably moves and thereby protrudes beyond the lower member 900 in the second direction (or the Y-axis direction), the second display area DA2 may not overlap the lower member 900 in the third direction (or the Z-axis direction). Also, in case that the second display area DA2 of the display panel 100 may be stretched in the second direction (or the Y-axis direction), the amount by which the second display area DA2 protrudes beyond the lower member 900 can be increased. Thus, light incident from the rear of a display device 10 can be incident upon an eye E of a user at the front of the display device 10 through transmissive areas in the second display area DA2. Even though the eye E of the user may overlap the display panel 100 in the third direction (or the Z-axis direction), the eye E of the user can see the background at the rear of the display device 10 through the transmissive areas of the second display area DA2. Therefore, the user can see not only the background at the rear of the display device 10 through the transmissive areas of the second display area DA2, but also a virtual image displayed in the second display area DA2. In other words, since a real image and a virtual image can be superimposed on each other in the second display area DA2, the display device 10 can provide the user with augmented reality.

While embodiments are described above, it is not intended that these embodiments describe all possible forms thereof. Rather, the words used in the specification are words of description rather than limitation, and it is understood that various changes may be made without departing from the spirit and scope of the of the disclosure. The features of various embodiments may be combined to form further embodiments.

What is claimed is:

1. A display device comprising:
a display panel including a first display area having first pixels, and a second display area having second pixels; and
a lower member below the display panel, wherein
the second display area is configured to protrude beyond the lower member in a direction, and
the second display area further includes transmissive areas disposed adjacent to the second pixels.

2. The display device of claim 1, wherein a number of the first pixels per a unit area of the first display area is greater than a number of the second pixels per the unit area of the second display area.

3. The display device of claim 2, wherein each of the transmissive areas surrounds M second pixels, where M is a positive integer.

4. The display device of claim 1, further comprising:
a camera sensor overlapping the second display area in a thickness direction of the display panel when the second display area is not to protrude beyond the lower member in the direction.

5. The display device of claim 1, further comprising:
a camera sensor not overlapping the second display area in a thickness direction of the display panel when the second display area protrudes beyond the lower member.

6. The display device of claim 1, further comprising:
a camera sensor overlapping the first display area in a thickness direction of the display panel when the second display area protrudes beyond the lower member.

7. The display device of claim 1, wherein
the second display area of the display panel has a first area when the second display area protrudes beyond the lower member in the direction and is stretched in the direction,
the second display area of the display panel has a second area when the second display area protrudes beyond the lower member in the direction and is not stretched in the direction, and
the first area is greater than the second area.

8. A display device comprising:
a display panel including a first display area having first pixels, and a second display area having second pixels; and
a lower member below the display panel, wherein
the second display area is configured to be stretched in a direction, and
the second display area further includes transmissive areas disposed adjacent to the second pixels.

9. The display device of claim 8, wherein a number of the first pixels per a unit area of the first display area is greater than a number of the second pixels per the unit area of the second display area.

10. The display device of claim 9, wherein each of the transmissive areas surrounds M second pixels, where M is a positive integer.

11. The display device of claim 8, further comprising:
a camera sensor overlapping the second display area in a thickness direction of the display panel when the second display area is not stretched in the direction.

12. The display device of claim 8, further comprising:
a camera sensor overlapping the second display area in a thickness direction of the display panel when the second display area is stretched in the direction.

13. The display device of claim 1, wherein
the second display area of the display panel has a first area which overlaps the lower member in a thickness direction of the display panel when the second display area is stretched in the direction,
the second display area of the display panel has a second area which does not overlap the lower member in a thickness direction of the display panel when the second display area is stretched in the direction, and
the first area is greater than the second area.

* * * * *